(12) United States Patent
Shouji et al.

(10) Patent No.: US 11,869,745 B2
(45) Date of Patent: Jan. 9, 2024

(54) CHARGED PARTICLE BEAM DEVICE

(71) Applicant: Hitachi High-Tech Corporation, Tokyo (JP)

(72) Inventors: Minami Shouji, Tokyo (JP); Natsuki Tsuno, Tokyo (JP); Hiroya Ohta, Tokyo (JP); Daisuke Bizen, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 244 days.

(21) Appl. No.: 17/435,479

(22) PCT Filed: Mar. 27, 2019

(86) PCT No.: PCT/JP2019/013177
§ 371 (c)(1),
(2) Date: Sep. 1, 2021

(87) PCT Pub. No.: WO2020/194575
PCT Pub. Date: Oct. 1, 2020

(65) Prior Publication Data
US 2022/0139667 A1 May 5, 2022

(51) Int. Cl.
*H01J 37/28* (2006.01)
*H01J 37/22* (2006.01)
(Continued)

(52) U.S. Cl.
CPC ............ *H01J 37/28* (2013.01); *H01J 37/222* (2013.01); *H01J 37/224* (2013.01);
(Continued)

(58) Field of Classification Search
CPC .. H01J 37/00; H01J 37/02; H01J 37/28; H01J 37/26; H01J 37/222; H01J 37/224;
(Continued)

(56) References Cited

U.S. PATENT DOCUMENTS 9,177,757 B2   11/2015   Ban et al.
2003/0094572 A1   5/2003   Matsui et al.
(Continued)

FOREIGN PATENT DOCUMENTS

JP   2003151483 A   5/2003
JP   2005512339 A   4/2005
(Continued)

OTHER PUBLICATIONS

Search Report dated Jun. 18, 2019 in International Application No. PCT/JP2019/013177.
(Continued)

*Primary Examiner* — Jason L McCormack
(74) *Attorney, Agent, or Firm* — Miles & Stockbridge, P.C.

(57) ABSTRACT

An object of the invention is to provide a charged particle beam device capable of increasing the contrast of an observation image of a sample as much as possible in accordance with light absorption characteristics that change for each optical parameter. The charged particle beam device according to the invention changes an optical parameter such as a polarization plane of light emitted to the sample, and generates the observation image having a contrast corresponding to the changed optical parameter. An optical parameter that maximizes a light absorption coefficient of the sample is specified according to a feature amount of a shape pattern of the sample (refer to FIG. 5).

7 Claims, 20 Drawing Sheets

(51) Int. Cl.
*H01J 37/244* (2006.01)
*H01J 37/26* (2006.01)

(52) U.S. Cl.
CPC .......... *H01J 37/226* (2013.01); *H01J 37/244* (2013.01); *H01J 37/265* (2013.01); *H01J 2237/2448* (2013.01); *H01J 2237/2817* (2013.01)

(58) Field of Classification Search
CPC ...... H01J 37/226; H01J 37/244; H01J 37/265; H01J 37/228; H01J 2237/2448; H01J 2237/2817; H01J 2237/221; H01B 15/04; H01B 15/00
USPC .......................................... 250/306, 307, 311
See application file for complete search history.

(56) References Cited

U.S. PATENT DOCUMENTS

| | | | |
|---|---|---|---|
| 2003/0111601 A1* | 6/2003 | Adler | .................... H01J 37/285 250/306 |
| 2005/0045821 A1 | 3/2005 | Noji et al. | |
| 2008/0265159 A1* | 10/2008 | Hatakeyama | ........... G03F 7/162 250/306 |
| 2011/0204228 A1 | 8/2011 | Tsuno et al. | |
| 2012/0268724 A1 | 10/2012 | De Boer et al. | |
| 2014/0077078 A1* | 3/2014 | Hatakeyama | ...... G01N 23/2251 250/310 |
| 2017/0018403 A1 | 1/2017 | Koronel | |
| 2018/0364564 A1 | 12/2018 | Goldenshtein et al. | |

FOREIGN PATENT DOCUMENTS

| | | |
|---|---|---|
| JP | 2007132836 A | 5/2007 |
| JP | 5190119 B2 | 4/2013 |
| JP | 201432833 A | 2/2014 |
| TW | 201129795 A | 9/2011 |
| WO | 2003050841 A1 | 6/2003 |
| WO | 2010052854 A1 | 5/2010 |

OTHER PUBLICATIONS

Written Opinion dated Jun. 18, 2019 in International Application No. PCT/JP2019/013177.
Office Action dated Feb. 1, 2021 in Taiwanese Application No. 109102443.

* cited by examiner

FIG. 9

| | | $\lambda_1 f_x$ | $\lambda_1 f_y$ |
|---|---|---|---|
| LIGHT IRRADIATION METHOD | LIGHT OFF | S-POLARIZED LIGHT | P-POLARIZED LIGHT |
| SEM IMAGE | | | |

CHARGED PARTICLE BEAM DEVICE

TECHNICAL FIELD

The present invention relates to a charged particle beam device which irradiates a sample with a charged particle beam.

BACKGROUND ART

In a manufacturing process of a semiconductor device, in-line inspection measurement by using a scanning electron microscope (SEM) is an important inspection item for a purpose of improving yield. In particular, a low voltage SEM (LV SEM) using an electron beam having an acceleration voltage of several kV or less is extremely useful in inspection and measurement of a two-dimensional shape such as a resist pattern in a lithography process and a gate pattern in a previous process because an image having a shallow penetration depth of the electron beam and rich surface information can be obtained. However, since organic materials such as a resist and an antireflection film used in the lithography process have compositions close to each other, or silicon-based semiconductor materials constituting a transistor have compositions close to each other, it is difficult to obtain a difference in secondary electron emission from the materials. Since a sample made of such a material has a low SEM image contrast, visibility of an ultrafine pattern or a defect of a semiconductor device is reduced. As a method of improving the visibility of the SEM, a method of adjusting observation conditions such as an acceleration voltage and an irradiation current and a technique of discriminating energy of electrons emitted from the sample are known.

PTL 1 discloses a technique of controlling an image contrast of an SEM by irradiating an observation region of the SEM with light. Since excited carriers are generated by light irradiation, a conductivity of a semiconductor or an insulator changes. The difference in conductivity between the materials is reflected in a potential contrast of an SEM image. A conduction failure location of a semiconductor device or the like can be detected by controlling the potential contrast of the SEM by light irradiation. PTL 2 discloses a method of controlling image contrast of an SEM by selecting wavelengths of a plurality of lights, focusing on a difference in absorption characteristics of the light depending on a wavelength of the light to be emitted.

CITATION LIST

Patent Literature

PTL 1: JP-A-2003-151483
PTL 2: Japanese Patent No. 5190119

SUMMARY OF INVENTION

Technical Problem

In PTL 1 and PTL 2, the image contrast of the SEM is controlled by determining the wavelength of the light according to the difference in light absorption characteristics between materials. However, since the light absorption characteristics of the material also greatly depend on optical parameters other than the wavelength, the difference in the light absorption characteristics cannot be sufficiently utilized only by controlling a single optical parameter. Further, in a semiconductor device having a periodic pattern, since light absorption characteristics depend not only on a material but also on a pattern of the semiconductor device, it is difficult to control the image contrast of the SEM with high accuracy only by controlling the single optical parameter.

The invention has been made in view of the above problems, and an object of the invention is to provide a charged particle beam device capable of increasing the contrast of an observation image of a sample as much as possible in accordance with light absorption characteristics that change for each optical parameter.

Solution to Problem

A charged particle beam device according to the invention changes an optical parameter such as a polarization plane of light emitted to a sample, and generates an observation image having a contrast corresponding to a changed optical parameter. An optical parameter that maximizes a light absorption coefficient of the sample is specified according to a feature amount of a shape pattern of the sample.

Advantageous Effect

According to the charged particle beam device of the invention, since the observation image is acquired by irradiating the sample with light having different optical parameters, a contrast of the observation image can be increased by using suitable optical parameters corresponding to the light absorption characteristics of the sample.

BRIEF DESCRIPTION OF DRAWINGS

FIG. 9 is a diagram showing an observation image obtained by extracting a feature amount of a pattern shape from an SEM image of the sample 8 and using an optical parameter having the highest light absorption coefficient in accordance with each pattern.

DESCRIPTION OF EMBODIMENTS

<Basic Principle of Invention>

Figure 1:
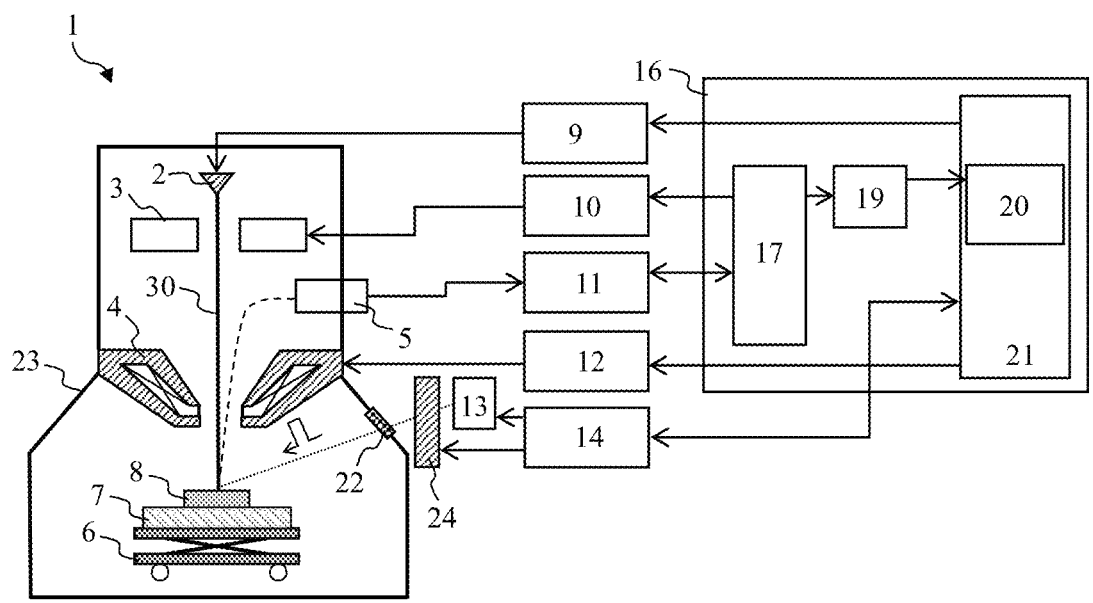
FIG. 1 is a configuration diagram of a charged particle beam device 1 according to a first embodiment.

Hereinafter, first, a basic principle of the invention will be described, and then a specific embodiment of the invention will be described. According to the invention, a light irradiation condition (optical parameter) having the highest image contrast is determined, and an image contrast with high visibility of a pattern or a defect is provided. The invention specifies a preferable light irradiation condition (a polarization plane, an irradiation direction, an irradiation angle, a wavelength, an irradiation cycle of light, an irradiation amount of light per unit time) including a plurality of parameters for light irradiation. By irradiating the sample with light, carriers are excited in the sample according to the number of photons, and an electron state changes. An emission amount of secondary electrons under the light irradiation is Math (1). ΔS is an amplification amount of emitted electrons by light irradiation, α is an absorption coefficient of the material, and $D_{pulse}$ is an irradiation amount of light per unit time to the sample.

$$\Delta S \propto \alpha \cdot D_{pulse} \quad \text{[Math 1]}$$

The irradiation amount of light per unit time is expressed by Math (2). $W_{ave}$ is average output of light, $f_{pulse}$ is a frequency in a case of a pulsed laser, and $N_{shot}$ is the number of pulses irradiated per unit time. In a continuous laser that continuously oscillates light, the average output of the light is the irradiation amount $D_{ew}$ of the light per unit time.

$$D_{pulse} = (W_{ave}/f_{pulse}) \cdot N_{shot} \quad \text{[Math 2]}$$

The absorption coefficient α is expressed by Math (3), where κ is an extinction coefficient, and λ is a wavelength of light.

$$\alpha \leq 4\pi\kappa/\lambda \quad \text{[Math 3]}$$

The extinction coefficient κ is expressed by Math (4). R is a reflectance with respect to light intensity, and θ is a deviation in a phase of light.

$$\kappa = 2\sqrt{R} \sin \theta / (1+R-2\sqrt{R} \cos \theta) \quad \text{[Math 4]}$$

The reflectance R varies depending on whether the polarization plane is the p-polarized light or the s-polarized light, and is expressed by Math (5) and (6), respectively. $R_p$ is a reflectance of the p-polarized light, and $R_s$ is a reflectance of the s-polarized light. N is the complex refractive index of a material, and φ is an irradiation angle. That is, it can be seen that an emission efficiency of secondary electrons depends not only on a wavelength but also on the irradiation amount of light per unit time, the polarization plane, and the irradiation angle of light.

$$R_p = |N^2 \cos\varphi - \sqrt{N^2-\sin^2\varphi}|^2 / |N^2 \cos\varphi + \sqrt{N^2-\sin^2\varphi}|^2 \quad \text{[Math 5]}$$

$$R_s = |\cos\varphi - \sqrt{N^2-\sin^2\varphi}|^2 / |\cos\varphi + \sqrt{N^2-\sin^2\varphi}|^2 \quad \text{[Math 6]}$$

First Embodiment

In the first embodiment of the invention, there will be described a charged particle beam device that controls an amount of emitted electrons from the sample at the time of electron beam irradiation by controlling the polarization plane and other optical parameters of an intermittently irradiated light to achieve image acquisition having a high image contrast.

FIG. 1 is a configuration diagram of a charged particle beam device 1 according to the first embodiment. The charged particle beam device 1 is configured as a scanning electron microscope that acquires an observation image of the sample 8 by irradiating the sample 8 with an electron beam 30 (primary charged particle). The charged particle beam device 1 includes an electron optical system, a stage mechanism system, an electron beam control system, a light irradiation system, and a main console 16.

The electron optical system includes an electron gun 2, a deflector 3, an electron lens 4, and a detector 5. The stage mechanism system includes the XYZ stage 6 and a sample holder 7. The electron beam control system includes an electron gun control unit 9, a deflection signal control unit 10, a detection control unit 11, and an electronic lens control unit 12. The light irradiation system includes a light source 13, a light control unit 14, a light irradiation unit 24, and an input setting unit 21. The main console 16 includes an image forming system and an input and output system. The image forming system includes an image processing unit 17 having a detection sampling function synchronized with a deflection signal and an image signal processing unit 19. The input and output system includes an input setting unit 21 for imaging conditions of the electron beam 30 and a display unit 20.

The electron beam 30 accelerated by the electron gun 2 is focused by the electron lens 4, and is emitted onto the sample 8. The deflector 3 controls an irradiation position of the electron beam 30 on the sample 8. The detector 5 detects emitted electrons (secondary charged particles) emitted from the sample 8 by irradiating the sample 8 with the electron beam 30. The input setting unit 21 is a functional unit for a user to specify and input an acceleration voltage, an irradiation current, a deflection condition, a detection sampling condition, an electron lens condition, and the like.

The light source 13 emits light to be emitted to the sample 8. The light source 13 is a laser capable of outputting a single wavelength or multiple wavelengths in a region from ultraviolet to near-infrared ray. The light emitted from the light source 13 is emitted onto the sample 8 installed in a vacuum via a glass window 22 provided in a device housing 23. The light control unit 14 controls an optical parameter indicating a physical property emitted by the light source 13. The user designates the optical parameter for the light control unit 14 via the input setting unit 21.

Figure 2:
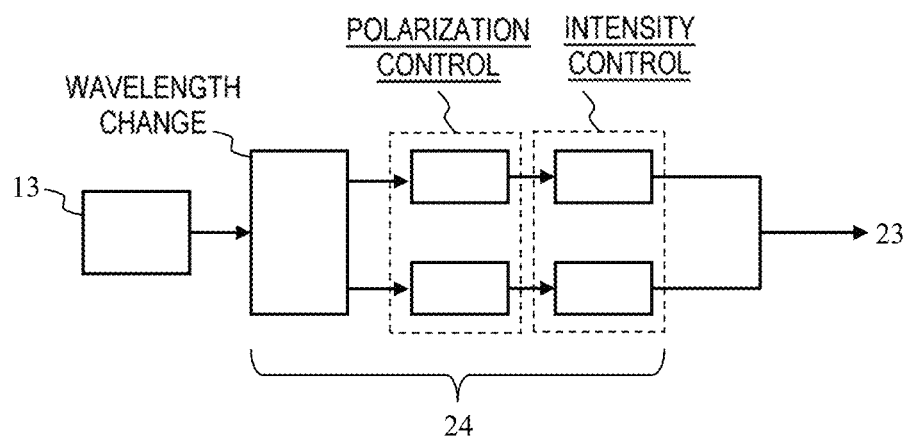
FIG. 2 is a diagram showing a configuration for irradiating a sample 8 with light emitted from a light source 13 after controlling the light to a wavelength/polarization plane/irradiation amount set by a user.

FIG. 2 is a diagram showing a configuration for irradiating the sample 8 with light emitted from the light source 13 after controlling the light to a wavelength/polarization plane/irradiation amount set by the user. In general, the polarization plane includes linearly polarized light and circularly polarized light. The linearly polarized light has the p-polarized light and the s-polarized light, and the circularly polarized light has a counterclockwise direction and a clockwise direction. The light irradiation unit 24 controls the wavelength/polarization plane/irradiation amount of the light to be emitted. The light irradiation unit 24 may be configured by, for example, a wavelength conversion unit, a polarization control unit, and an intensity control unit. The polarization control unit is a component capable of changing the polarization plane of light, and is, for example, a wire grid type or a crystal type using a birefringence phenomenon of a material itself. The intensity control unit can control the light intensity by, for example, a pulse width of light. The light irradiation unit 24 can change the optical parameters using the devices.

Figure 3A:
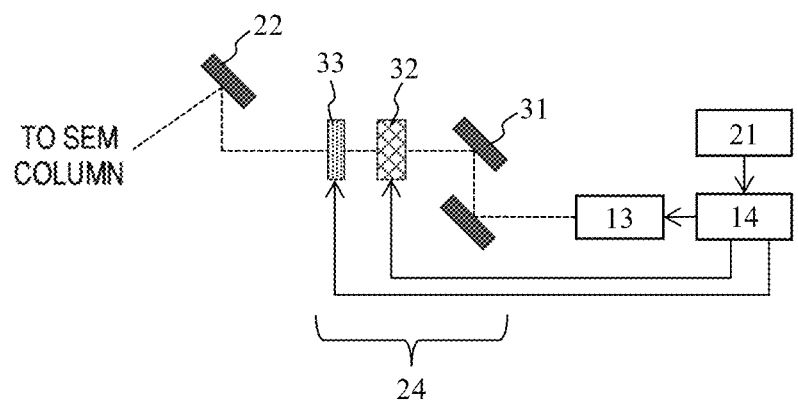
FIG. 3A is a diagram showing a configuration example in which a light control unit 14 controls optical parameters in accordance with conditions set via an input setting unit 21.

FIG. 3A is a diagram showing a configuration example in which the light control unit 14 controls optical parameters in accordance with conditions set via the input setting unit 21. The light control unit 14 controls the optical parameters of the light emitted onto the sample 8 by controlling the respective control elements included in the light irradiation unit 24. The light control unit 14 further controls an optical parameter such as a wavelength of light emitted from the light source 13. FIG. 3A is a diagram showing a configuration example of the polarization plane and controlling an irradiation amount per unit time. The light irradiation unit 24 includes a polarization conversion plate 32 and a light amount variable filter 33, and the light control unit 14 controls the polarization conversion plate 32 and the light amount variable filter 33.

The light emitted from the light source 13 is converted into a polarization plane specified by the input setting unit 21 by the polarization conversion plate 32. The light amount variable filter 33 controls the light amount so as to obtain the irradiation amount per unit time specified by the input setting unit 21. A light whose irradiation amount per unit time and the polarization plane are adjusted is emitted to the sample 8 via an adjustment mirror 31 and the glass window 22.

Figure 3B:
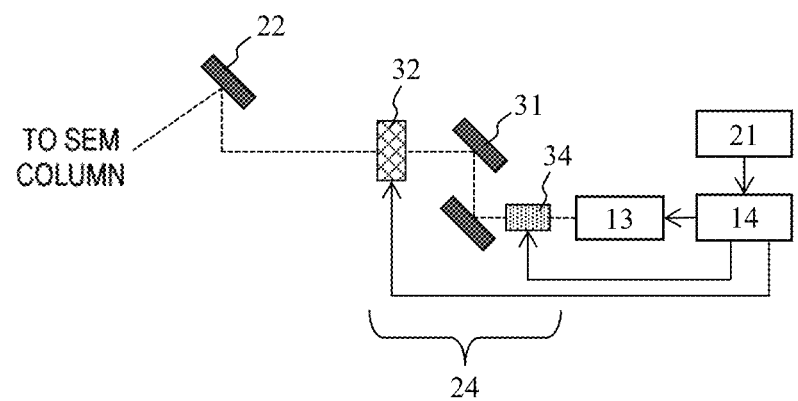
FIG. 3B is a diagram showing a configuration example of controlling the wavelength of light and the polarization plane.

FIG. 3B is a diagram showing a configuration example of controlling the wavelength of light and the polarization plane. The light irradiation unit 24 includes a wavelength conversion unit 34 and the polarization conversion plate 32. The light emitted from the light source 13 is adjusted by the wavelength conversion unit 34 so as to be emitted at the wavelength designated by the input setting unit 21, and the polarization plane is controlled by the polarization conversion plate 32.

Figure 4:
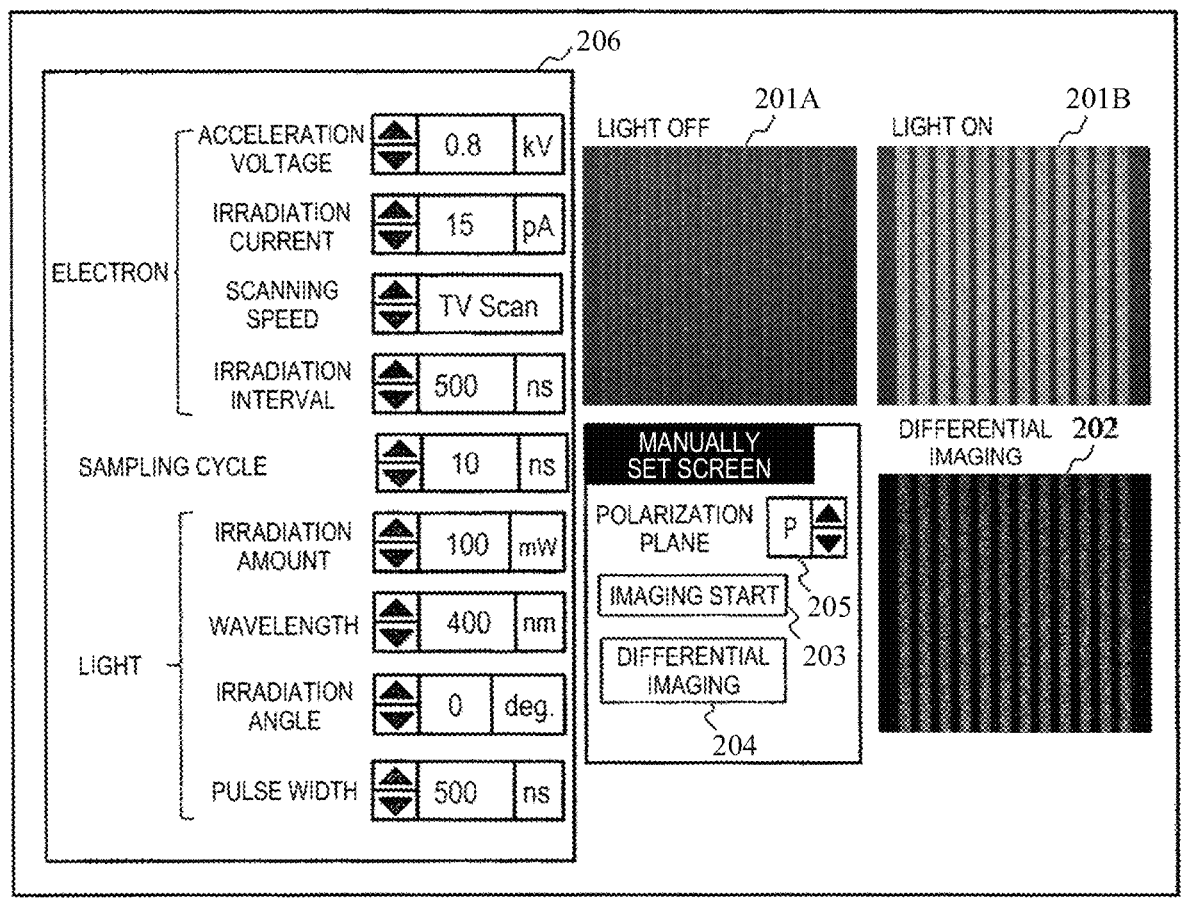
FIG. 4 is a diagram showing an example of a GUI provided by a display unit 20.

FIG. 4 is a diagram showing an example of a graphical user interface (GUI) provided by the display unit 20. The image acquisition operation specifying unit 206 is a field for setting the acceleration voltage/the irradiation current/a scanning speed/the irradiation interval of the electron beam 30, and setting a sampling cycle/the irradiation amount per unit time/the wavelength/the irradiation angle/the irradiation intensity (the pulse width) of the light to be emitted. A polarization plane setting unit 205 is a field for setting the polarization plane of the light. For example, any one of the p-polarized light, the s-polarized light, the circularly polarized light, and an elliptically polarized light can be selected. A display unit 201A displays an SEM image when the light is not emitted, and a display unit 201B displays the SEM image when the light having a set polarization plane is emitted. A difference image display unit 202 displays a difference image of the SEM images displayed by the display units 201A and 201B. The image processing unit 17 generates the difference image by subtracting the SEM image at the time of no light irradiation from the SEM image at the time of light irradiation. The user can confirm an effect of improving the contrast by light irradiation by checking a part emphasized by the light irradiation via the difference image. An imaging start button 203 is a button for instructing the charged particle beam device 1 to start imaging the observation image of the sample 8. A differential imaging button 204 is a button for instructing the charged particle beam device 1 to generate the difference image.

Figures 5, 6:
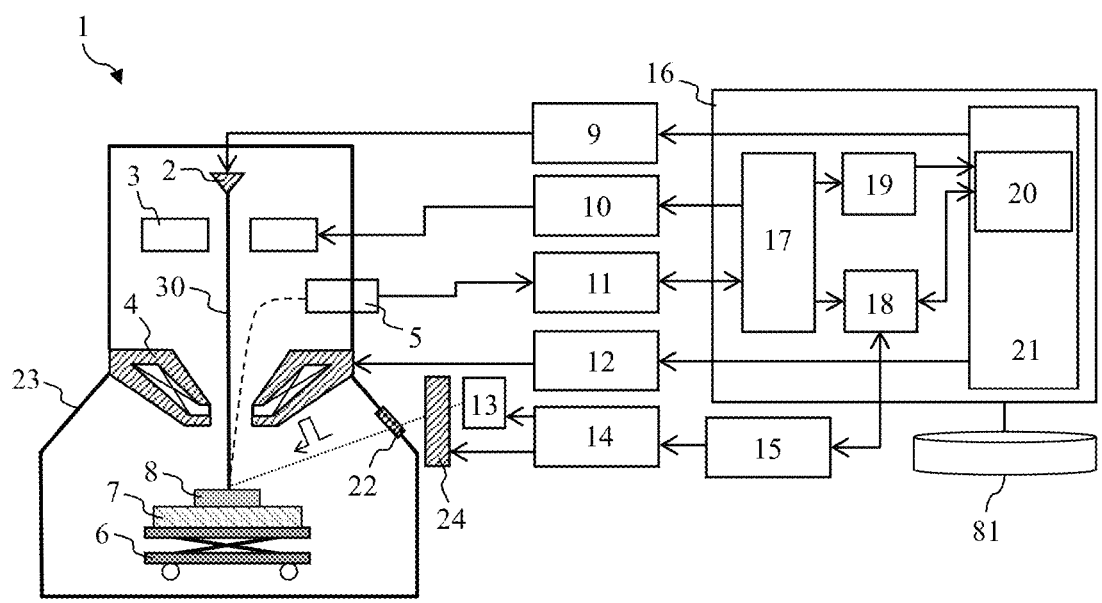
FIG. 5 is a diagram showing an example of an SEM image captured by adjusting the polarization plane in accordance with a pattern shape.
FIG. 6 is a configuration diagram of a charged particle beam device 1 according to a second embodiment.

FIG. 5 is a diagram showing an example of an SEM image captured by adjusting the polarization plane in accordance with a pattern shape. As the sample 8, a sample in which a resist 42 was applied on an anti-reflection film 41 was used. The resist 42 formed on the anti-reflection film 41 is formed as a line-and-space pattern having different pitches. The wavelength at which the absorption coefficients of the resist 42 and the anti-reflection film 41 used in the evaluation shown in FIG. 5 were the highest was 200 nm for the resist 42 and 400 nm for the anti-reflection film 41. A pitch width of the line and space is 500 nm for a line pitch A and 250 nm for a line pitch B. Electron beam irradiation conditions are an acceleration voltage of 0.8 keV, an irradiation current of 15 pA, and a scanning speed of a TV rate scan. The light irradiation conditions were a wavelength of 400 nm, an irradiation amount of light per unit time of 100 mW, and the polarization plane of the p-polarized light and the s-polarized light. The irradiation angle was 30 degrees. A detection sampling frequency is 100 MHz.

At the line pitch A, when p-polarized light is emitted, an image brightness of the anti-reflection film 41 is brighter than that of the resist 42, and therefore the image contrast between the anti-reflection film 41 and the resist 42 is improved. On the other hand, when s-polarized light is emitted, the contrast between the anti-reflection film 41 and the resist 42 is low. Under the irradiation condition, since the p-polarized light is efficiently absorbed by the anti-reflection film 41, a high image contrast is obtained. At the line pitch B, the light is efficiently absorbed by the anti-reflection film 41 when the s-polarized light is emitted, and therefore the image contrast is improved. On the other hand, when p-polarized light is emitted, the image contrast is low.

First Embodiment: Overview

The charged particle beam device 1 according to the first embodiment generates an observation image of the sample 8 for each optical parameter while changing the optical parameter including the polarization plane of light, and thus generates an observation image having a different contrast for each optical parameter. As a result, observation images having different contrasts according to the light absorption characteristics of the sample 8 with respect to the respective optical parameters can be obtained. Therefore, a visibility of the observation image can be improved by selecting the optical parameter in accordance with the light absorption characteristics of the sample 8.

The charged particle beam device 1 according to the first embodiment generates observation images having different contrasts corresponding to respective optical parameters, generates a difference image between the observation images, and displays the difference image on the difference image display unit 202. Accordingly, a difference between observation images having different contrasts can be clearly visually recognized.

Although FIG. 5 shows an example in which the polarization plane is adjusted as the optical parameter, the contrast of the observation image may be adjusted by adjusting other optical parameters according to the light absorption characteristics of the sample 8. For example, the irradiation amount of light per unit time, the pulse width, an irradiation angle (elevation angle), the wavelength, the irradiation direction (azimuth angle), the irradiation cycle of light, and the like can be adjusted. The irradiation angle is an angle formed between a perpendicular line (Z-axis) and the electron beam 30 on a vertical plane. The irradiation direction is an angle formed between the electron beam 30 and one of the coordinate axes (XY axes) on a horizontal plane.

Second Embodiment

In a second embodiment of the invention, a configuration example will be described in which the feature amount of the shape pattern of the sample 8 is extracted and then the optical parameter of the light with which the sample 8 is irradiated is controlled according to the feature amount.

FIG. 6 is a configuration diagram of a charged particle beam device 1 according to the second embodiment. The charged particle beam device 1 according to the second embodiment includes a feature amount extraction unit 18 and an optical parameter specifying unit 15 in addition to the configuration described in the first embodiment. The feature amount extraction unit 18 acquires a shape pattern of the sample 8 and extracts the feature amount of the shape pattern. The optical parameter specifying unit 15 determines a parameter that maximizes the absorption coefficient of the light with which the sample 8 is irradiated, according to the feature amount. The feature amount extraction unit 18 extracts the feature amount such as dimension/density/period/area/contour line of the shape pattern/photophysical property of the material constituting the sample 8 from the SEM image, an electron emitting signal, design data, and the like. A storage device 81 will be described later.

Figure 7:
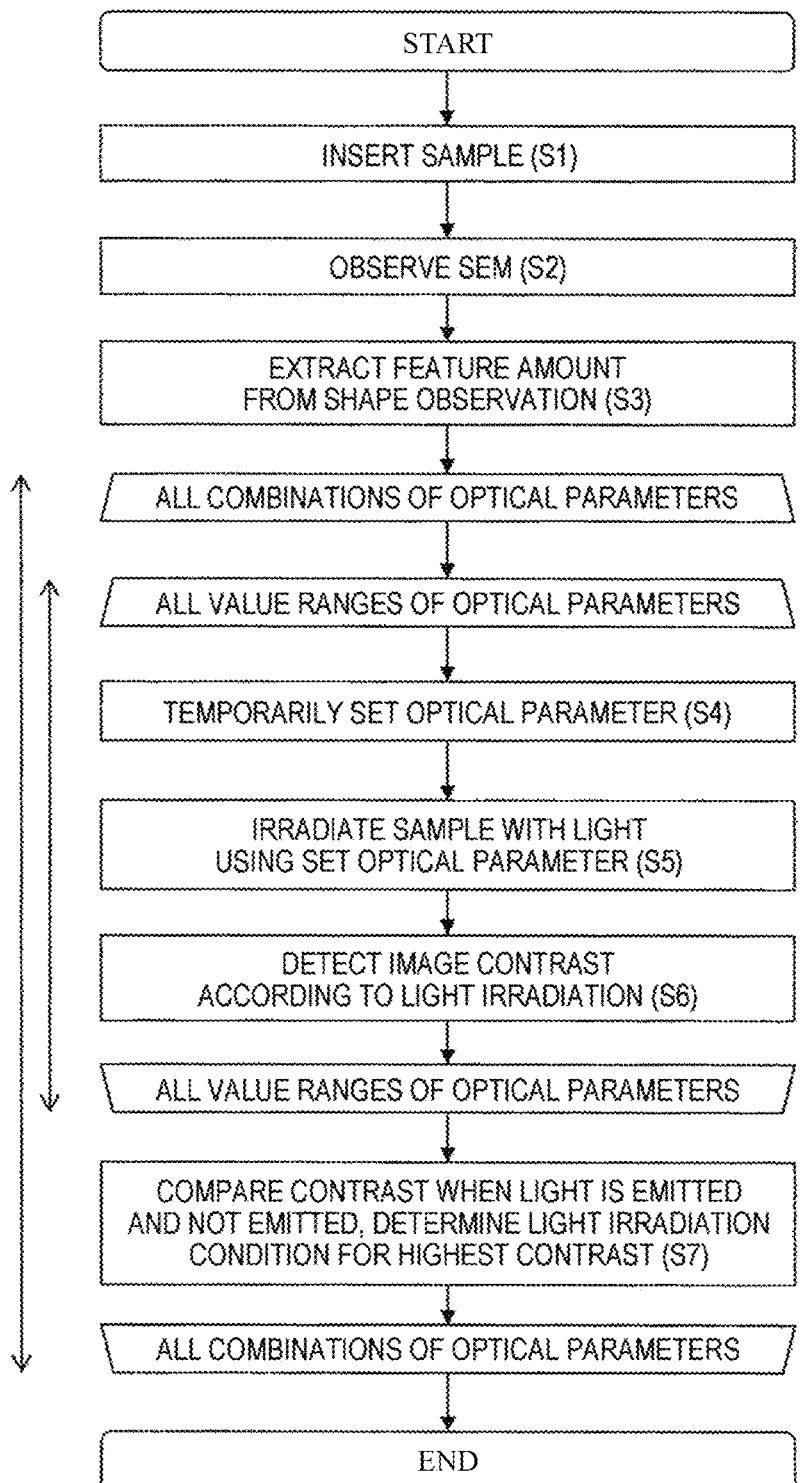
FIG. 7 is a flowchart showing a procedure in which an optical parameter specifying unit 15 determines an optical parameter.

FIG. 7 is a flowchart showing a procedure in which the optical parameter specifying unit 15 determines the optical parameter. Hereinafter, each step of FIG. 7 will be described.
(FIG. 7: Steps S1 to S3)

The user inserts the sample 8, and the stage mechanism system moves the sample to an observation position (S1). The user sets an irradiation condition such as an irradiation current of the electron beam 30, and the image processing unit 17 acquires an SEM image of the sample 8 according to the irradiation condition (S2). The feature amount extraction unit 18 extracts the shape pattern of the sample 8 and the feature amount thereof from the SEM image obtained in S2 (S3).
(FIG. 7: Steps S4 to S6)

The optical parameter specifying unit 15 temporarily sets the optical parameter (for example, the irradiation amount per unit time) to any value (S4). The light control unit 14 and the light irradiation unit 24 irradiate the sample 8 with light using the optical parameters (S5). The image processing unit 17 acquires the SEM image of the sample 8 and calculates the contrast of the SEM image (S6). Steps S4 to S6 are repeated while changing a value of the optical parameter. For example, when the irradiation amount per unit time is temporarily set as the optical parameter in step S4, S4 to S6 are repeated over an entire settable numerical range while changing a numerical value of the irradiation amount.
(FIG. 7: Step S7)

The optical parameter specifying unit 15 compares the contrast at each value of the optical parameter with the image contrast when light is not emitted. The optical parameter specifying unit 15 adopts a value having the highest contrast. When the contrast is the highest when light is not emitted, "no irradiation" is adopted as the optical parameter.
(FIG. 7: Steps S4 to S7)

Steps S4 to S7 are repeatedly performed for all combinations of the optical parameters. For example, S4 to S7 are performed for the irradiation amount per unit time, and then S4 to S7 are performed for the wavelength. Similar steps are applied to other optical parameters. Examples of the combination of the optical parameters include parameters that can be specified on the image acquisition operation specifying unit 206 in FIG. 4.

Figure 8A:
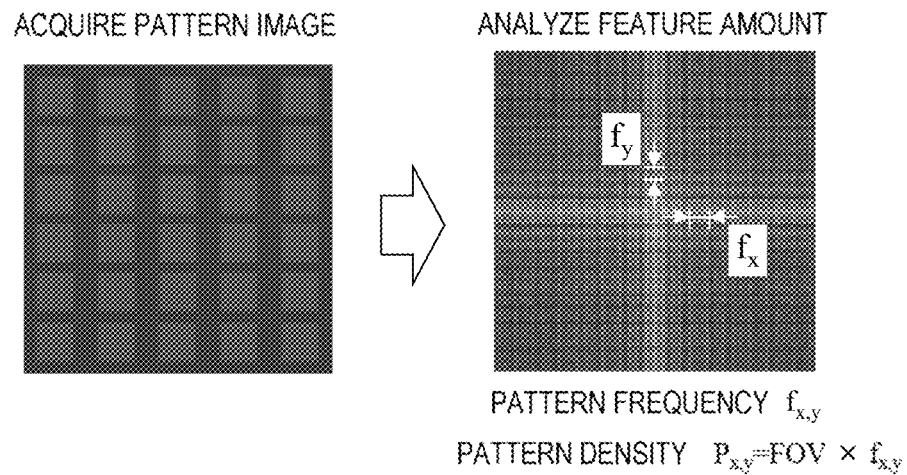
FIG. 8A is a diagram showing an example in which Fourier transform is used as a method of extracting a feature amount of a shape of a sample having a periodic shape.

FIG. 8A shows an example in which Fourier transform is used as a method of extracting a feature amount of a shape of a sample having a periodic shape. The detector 5 detects emitted electrons (secondary charged particles) emitted from the sample 8 by irradiating the sample 8 with the electron beam 30 in accordance with the irradiation conditions set by the input setting unit 21. The image processing unit 17 converts the electron emitting signal into an image. The feature amount extraction unit 18 performs Fourier transform on the SEM image, analyzes the shape pattern of the sample 8 by frequency analysis, and extracts feature amounts such as dimensions and pitches. A width from an image center to a bright point or a bright line is a pattern frequency of each shape, and a pattern dimension can be calculated from a reciprocal of the pattern frequency.

In FIG. 8A, $f_x$ is the pattern frequency of the sample in an X direction, and $f_y$ is the pattern frequency in a Y direction. In FIG. 8A, it can be seen that $f_x$ is a value smaller than $f_y$. A pattern density $P_x$ in the X direction and a pattern density $P_y$ in the Y direction are set, $P_x$ is a product of FOV and $f_x$, and $P_y$ is a product of FOV and $f_y$. In FIG. 8A, the pattern density $P_x$ in the X direction where the pattern frequency is low is lower than the pattern density $P_y$ in the Y direction where the pattern frequency is high.

Figure 8B:
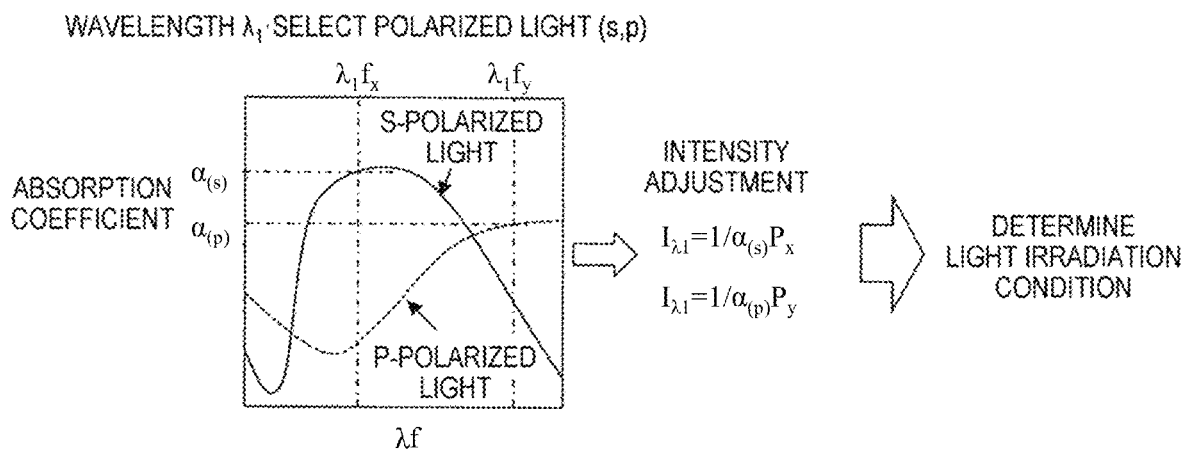
FIG. 8B is a diagram showing a method of determining a polarization plane from the feature amount.

FIG. 8B is a diagram showing a method of determining a polarization plane from the feature amount. A horizontal axis of FIG. 8B is the product of a wavelength λ of light and a pattern frequency f, and corresponds to a parameter representing a diffraction efficiency. A vertical axis represents the absorption coefficient for each of the p-polarized light and the s-polarized light with respect to the sample. The graph can be made into a database in advance by optical simulation or actual measurement. FIG. 8B shows values when the wavelength is $\lambda_1$. In $\lambda_1 f_x$, the absorption coefficient for the light of the sample 8 is higher in the s-polarized light than in the p-polarized light, and in $\lambda_1 f_y$, the light absorption coefficient of the sample 8 is higher in the p-polarized light. As shown in Math (1), as the sample 8 is irradiated with more light having a polarization plane having a large light absorption coefficient, the change in image brightness increases, and the contrast is also improved.

In order to make the effect of improving the contrast with respect to the pattern in the X direction and the pattern in the Y direction uniform, the light intensity $I_s$ of the s-polarized light and the light intensity $I_p$ of the p-polarized light may be adjusted by dividing the light intensity $I_s$ of the s-polarized light and the light intensity $I_p$ of the p-polarized light by the product ($\alpha_s P_x$, $\alpha_p P_y$) of the absorption coefficients $\alpha_s$, $\alpha_p$ of the s-polarized light and the p-polarized light and the pattern densities $P_x$, $P_y$. The details will be described in a third embodiment to be described later.

FIG. 9 is a diagram showing an observation image obtained by extracting the feature amount of the pattern shape from the SEM image of the sample 8 and using the optical parameter having the highest light absorption coefficient in accordance with each pattern. As the sample 8, a sample in which an oxide film 45 was formed on an underlying silicon substrate 43 and a polysilicon 44 was formed on the oxide film 45 was used. The polysilicon 44 is formed in an island shape having different pitches in the X and Y directions. Irradiation conditions of the electron beam 30 are an acceleration voltage of 1.5 keV, an irradiation current of 300 pA, and a scanning speed of 150 nsec/pixel. The light irradiation conditions were a wavelength of 535 nm, and P or s-polarized light was irradiated on the polarization plane in accordance with a pattern in which the contrast was desired to be improved. The detection sampling frequency is 400 MHz.

It can be seen from FIG. 8B that the absorption coefficient for s-polarized light is high for the pattern frequency $f_x$ in the X direction, and the absorption coefficient for p-polarized light is high for the pattern frequency fy in the Y direction. Here, in consideration of the pattern densities $P_x$ and $P_y$, and the absorption coefficients $\alpha_s$ and $\alpha_p$, the irradiation amount of light per unit time of s-polarized light was set to 7 mW, and the irradiation amount of light per unit time of p-polarized light was set to 10 mW. In the example of FIG. 9, when the s-polarized light is emitted, the oxide film 45 of the shape pattern in the X direction has an enhanced image contrast, and a change with respect to the pattern in the Y direction is small. On the other hand, when the p-polarized light is emitted, the image brightness of the oxide film 45 in a Y-direction pattern is increased and the contrast in the Y direction is enhanced, as compared with a change in the image brightness with respect to the pattern in the X direction. As described above, by using the light irradiation parameter including the polarization plane corresponding to the direction of the pattern shape, it is possible to perform any contrast control.

Figure 10:
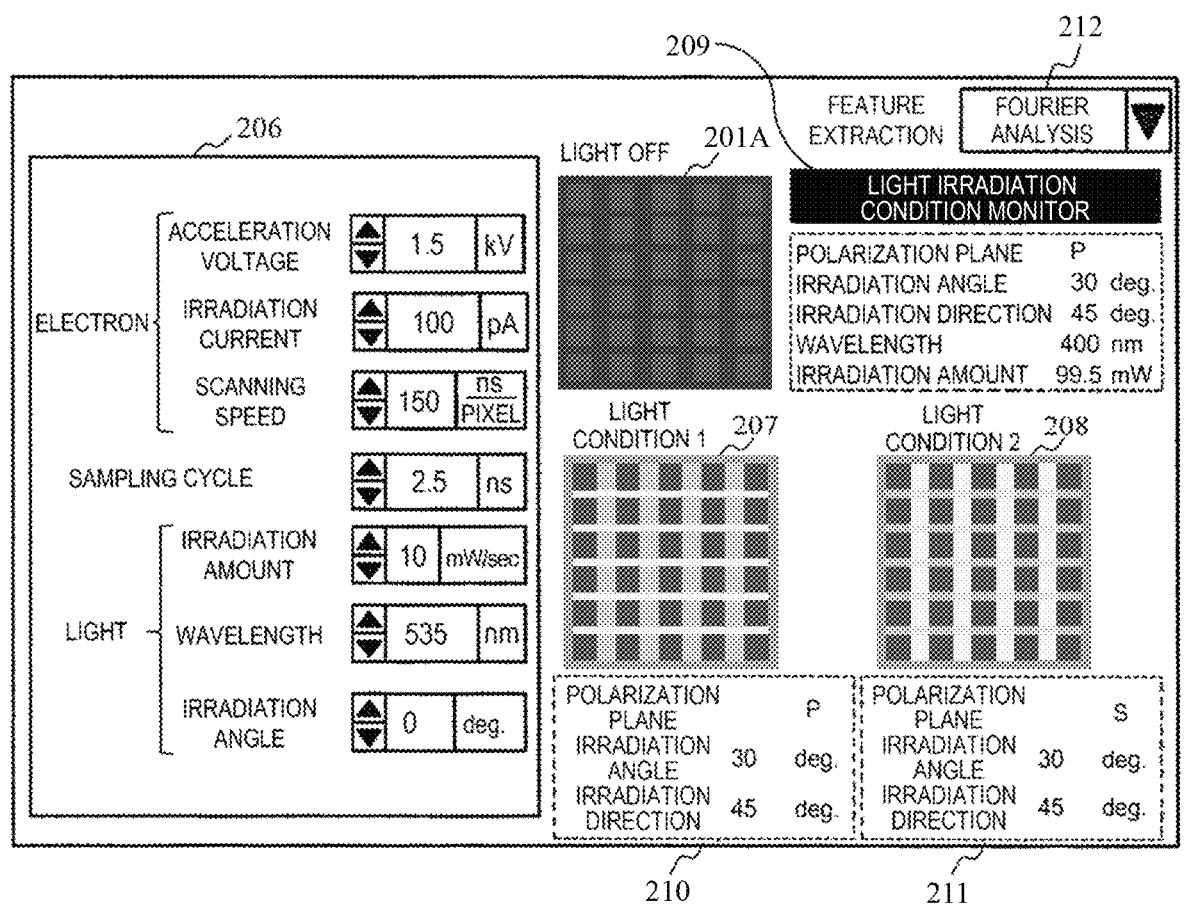
FIG. 10 is an example of a GUI provided by the display unit 20 in the second embodiment.

FIG. 10 is an example of a GUI provided by the display unit 20 in the second embodiment. In a feature amount extraction field 212, a method of extracting a feature amount can be selected. For example, in addition to the Fourier analysis of the observation image illustrated in FIG. 8A, a method of extracting the feature amount of the shape pattern from the design data, a method of measuring the pattern dimension on the observation image, and the like are exemplified.

When a correspondence relationship between the feature amount and the optical parameter capable of maximizing the image contrast of the sample 8 having the feature amount is stored in advance as the database, the optical parameter specifying unit 15 can automatically specify the optical parameter corresponding to the extracted feature amount by referring to the database. In this case, it is not necessary to execute the flowchart of FIG. 7, and it is possible to automatically select each optical parameter corresponding to the feature amount on a screen of FIG. 10. The database can be configured by, for example, storing data describing the correspondence relationship between the feature amount and the optical parameter in the storage device 81.

The display units 207 and 208 display observation images with different optical parameters. A light irradiation condition monitoring unit 209 displays a current value of the optical parameters. The imaging condition display units 210 and 211 display imaging conditions corresponding to the display units 207 and 208, respectively.

Second Embodiment: Overview

The charged particle beam device 1 according to the second embodiment specifies an optical parameter having the highest light absorption coefficient in the feature amount according to the feature amount of the sample 8, and acquires an observation image after emitting light having the optical parameter. Accordingly, the contrast of the observation image can be increased as much as possible for each shape pattern of the sample 8.

The charged particle beam device 1 according to the second embodiment specifies an optical parameter capable of increasing the contrast by referring to a database describing the correspondence relationship between the feature amount and the optical parameter, or by searching for an optical parameter corresponding to the feature amount according to the flowchart in FIG. 7. When a database is used, an optimum optical parameter can be quickly specified. Even when the database cannot be prepared in advance, the optical parameters can be specified according to FIG. 7. Further, the database can be constructed by storing the optical parameters specified according to FIG. 7 in the storage device 81.

Third Embodiment

In the shape pattern described in FIG. 9, since the feature amount in the X direction and the feature amount in the Y direction of the shape pattern are different from each other, the light absorption coefficients in the respective directions are different from each other. Therefore, in a third embodiment of the invention, a procedure for uniformly improving the contrast in each observation direction even when the feature amounts in observation directions are different will be described. The configuration of the charged particle beam device 1 is similar as that according to the second embodiment.

Figure 11A:
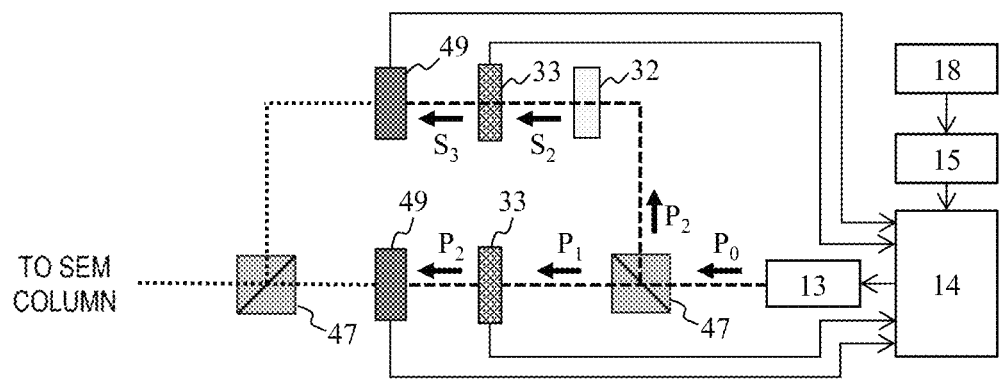
FIG. 11A is a diagram showing an optical path configuration when an irradiation ratio of p-polarized light and s-polarized light is measured and an irradiation amount of light is adjusted in accordance with a feature amount of a shape pattern.

FIG. 11A is an diagram showing an optical path configuration when the irradiation ratio of the p-polarized light and the s-polarized light is measured and the irradiation amount of light is adjusted in accordance with the feature amount of the shape pattern. The light amount variable filter 33 adjusts the irradiation amount per unit time. The p-polarized light is emitted from the light source 13 and split into two optical paths by a non-polarization beam splitter 47. In one optical path, the irradiation amount per unit time is adjusted by the light amount variable filter 33 while the p-polarized light is maintained, and the irradiation amount of light per unit time of the p-polarized light is measured by a beam monitor 49. In another optical path, after the polarization plane is converted from the p-polarized light to the s-polarized light by using the polarization conversion plate 32, the irradiation amount per unit time is adjusted by the light amount variable filter 33, and the irradiation amount of light per unit time of the s-polarized light is measured by the beam monitor 49.

Figure 11B:
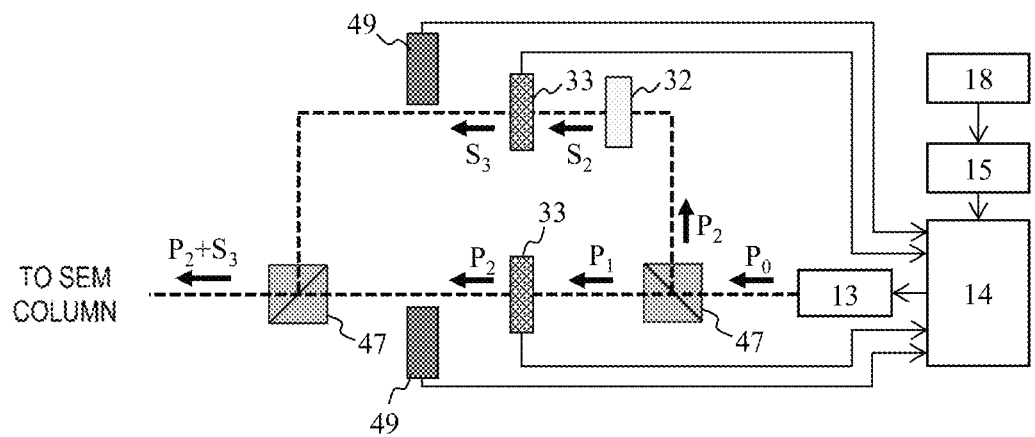
FIG. 11B is a diagram showing an optical path configuration after the irradiation amount is adjusted.

FIG. 11B is a diagram showing an optical path configuration after the irradiation amount is adjusted. In accordance with the irradiation amount measured in the optical path configuration of FIG. 11A, the light control unit 14 controls the irradiation amount in accordance with the shape pattern of the sample using a procedure described later. The beam monitor 49 is movable, and is removed from an optical path when the adjustment of the irradiation amount per unit time is completed.

Figure 12A:
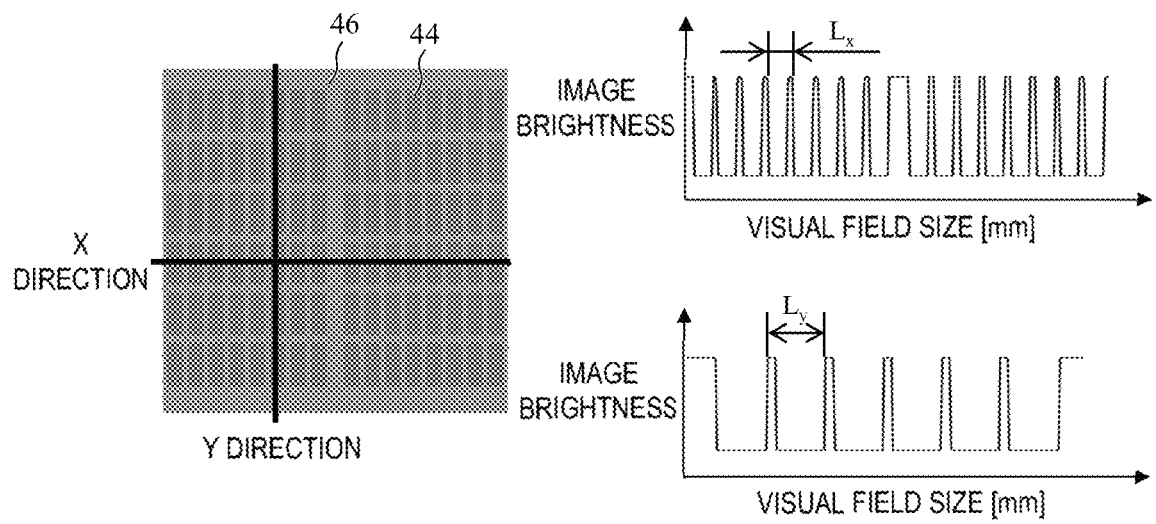
FIG. 12A is a diagram showing an example of a procedure for extracting the feature amount of the sample.

FIG. 12A is a diagram showing one example of a procedure for extracting the feature amount of the sample. In FIG. 12A, the feature amount extraction unit 18 acquires line profiles in each of the X direction and the Y direction, and extracts feature amounts such as a line dimension and a line pitch. In FIG. 12A, the line pitch is extracted as the feature amount. The line pitch can be extracted as, for example, a brightness peak interval of the observation image. In FIG. 12A, the line pitch in the X direction is $L_x$, and the line pitch in the Y direction is $L_y$.

Figure 12B:
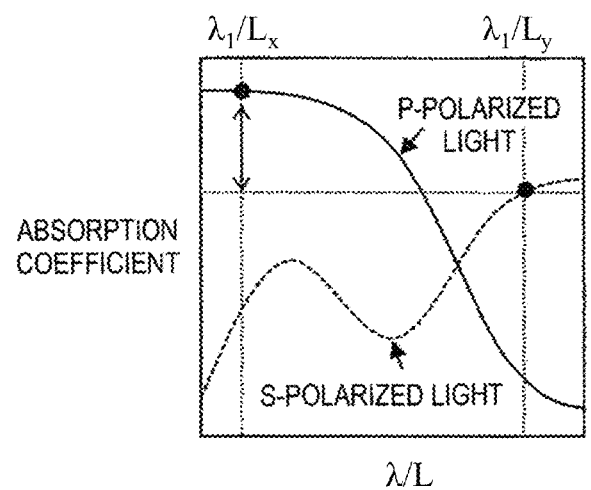
FIG. 12B is a diagram showing a method of determining a light irradiation condition from a feature amount extracted by a feature amount extraction unit 18.

FIG. 12B is a diagram showing a method of determining the light irradiation condition from the feature amount extracted by the feature amount extraction unit 18. In the graph of FIG. 12B, the horizontal axis represents a ratio between the wavelength λ and the line pitch L, and the vertical axis represents the absorption coefficient of irradiation light with respect to the sample 8. When the irradiation amount $D_p$ per unit time of the p-polarized light and the irradiation amount $D_s$ per unit time of the s-polarized light become equal to each other, the contrast at each line pitch is uniform. The irradiation amount per unit time of each polarization plane is calculated by Math (7) and (8). $α_p$ is an absorption coefficient of p-polarized light with respect to the wavelength λ and the line pitch L, $α_s$ is an absorption coefficient of s-polarized light with respect to the wavelength λ and the line pitch L, and $D^P_{pulse}$ and $D^S_{pulse}$ are irradiation amounts per unit time of the p-polarized light and the s-polarized light with which the sample 8 is irradiated. By adjusting either or both of $D^P_{pulse}$ and $D^S_{pulse}$ such that $D_p = D_s$ the contrast in each direction can be made uniform.

$$D_P = D_{pulse}^P · α_P \quad \text{[Math 7]}$$

$$D_S = D_{pulse}^S · α_S \quad \text{[Math 8]}$$

Figure 12C:
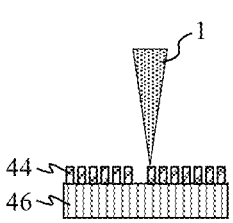
FIG. 12C is a diagram showing a result of observation by controlling the irradiation amount per unit time with respect to each polarization plane.

FIG. 12C is a diagram showing a result of observation by controlling the irradiation amount per unit time with respect to each polarization plane. As the sample 8, a sample in which a pattern of polysilicon 44 was formed on an underlying silicon carbide substrate 46 was used. The polysilicon 44 is formed in an island shape having different pitches in the X and Y directions. Irradiation conditions of the electron beam 30 are an acceleration voltage of 0.3 keV, an irradiation current of 1 nA, and a scanning speed of 20 nsec/pixel. The light irradiation conditions are a wavelength of 300 nm and a detection sampling of 2 nsec. The polarization plane and the irradiation amount per unit time were controlled such that the contrast was constant in accordance with the procedure described with reference to FIGS. 12A and 12B.

In order to make the effect of improving the contrast constant at each of the line pitches $λ_1/d_x$ and $λ_1/d_y$, from Math (7) and (8), it was found that it is necessary to control the irradiation amount per unit time of the p-polarized light to be ⅔ of the irradiation amount per unit time of the s-polarized light. Under the condition of the light irradiation OFF in FIG. 12C, a contrast difference between the polysilicon 44 and the silicon carbide substrate 46 is small. On the other hand, as a result of controlling the light irradiation amount per unit time for each polarized light according to the feature amount of the shape pattern, a uniform contrast improvement effect was confirmed.

Although in the third embodiment, the light amount variable filter 33 is used to control the irradiation amount per unit time, in the case of the pulse laser, a pulse picker may be used instead of the light amount variable filter 33 to control the number of pulses per unit time of p-polarized light to be ⅔ of the number of pulses per unit time of s-polarized light.

Figure 13:
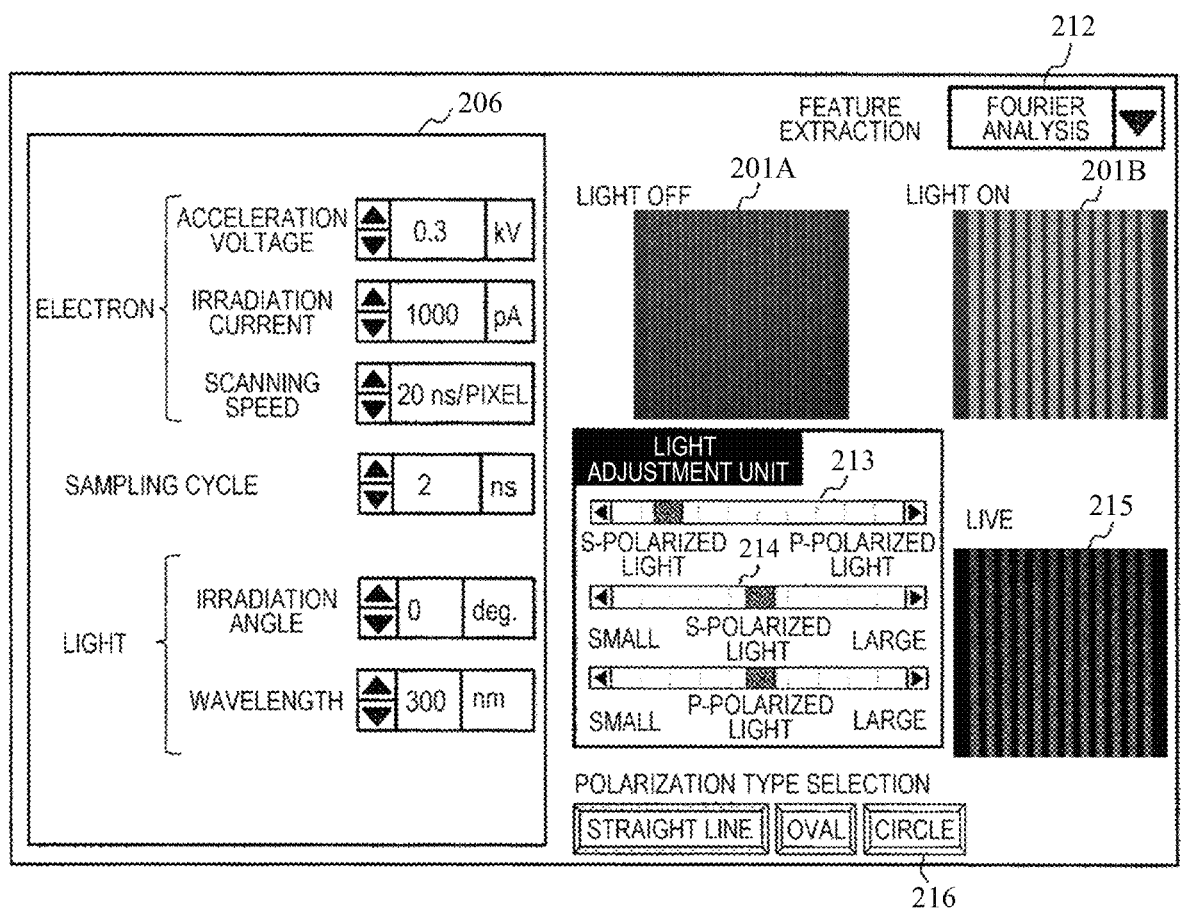
FIG. 13 is a diagram showing an example of a GUI provided by the display unit 20 in a third embodiment.

FIG. 13 is a diagram showing an example of the GUI provided by the display unit 20 in the third embodiment. In FIG. 13, the pattern dimension is extracted from the line profile as the feature amount. An SEM image in a case where light is not emitted is displayed on the display unit 201A, and an image captured under the determined light irradiation conditions is displayed on the display unit 201B. A polarization plane ratio adjusting unit 213 is a scroll bar used to manually adjust a ratio between the s-polarized light and the p-polarized light. An irradiation amount adjusting unit 214 is a scroll bar used to adjust the irradiation amount per unit time of each of the p-polarized light and the s-polarized light. A polarization type selection button 216 is used to select the polarization plane. A live image display unit 215 displays the SEM image during light irradiation condition extraction. The light control unit 14 selects the polarization plane of light and the irradiation amount per unit time according to the feature amount of the sample 8 in accordance with the procedure described above. A selection result thereof is automatically reflected on a screen of FIG. 13.

Third Embodiment: Overview

The charged particle beam device 1 according to the third embodiment specifies the optical parameter according to the feature amount of the pattern shape of the sample 8, and adjusts the irradiation amount per unit time for each optical parameter according to the light absorption coefficient corresponding to each optical parameter. Accordingly, the contrast for each optical parameter can be made uniform. Therefore, for example, even when the feature amount of the sample 8 is different for observation directions, uniform contrast can be obtained.

Fourth Embodiment

In a fourth embodiment of the invention, a configuration example will be described in which an optical parameter at which the emitted electrons emitted from the sample 8 is maximized is specified, and an observation image having high contrast can be obtained. The charged particle beam device 1 according to the fourth embodiment includes a mechanism for adjusting an angle of light emitted to the sample 8 in addition to the configurations described in the first to third embodiments. A functional unit (for example, the light irradiation unit 24) that adjusts the light irradiation conditions other than the angle may be installed either before or after the adjustment mirror 31.

Figure 14A:
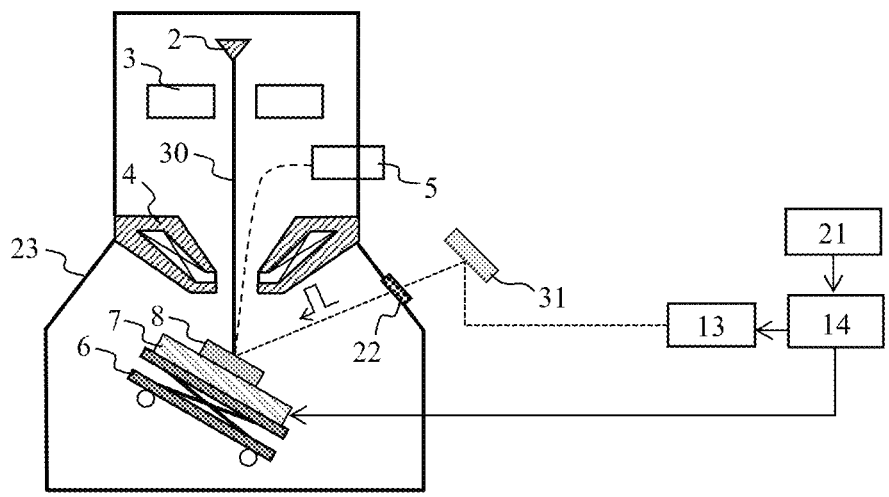
FIG. 14A is a diagram showing an example in which an angle of light emitted to the sample 8 is controlled by adjusting an inclination angle of an XYZ stage 6.

FIG. 14A is a diagram showing an example in which an angle of light irradiated to the sample 8 is controlled by adjusting the inclination angle of the XYZ stage 6. The light control unit 14 controls the angle of the light by specifying the inclination angle with respect to the XYZ stage 6.

Figure 14B:
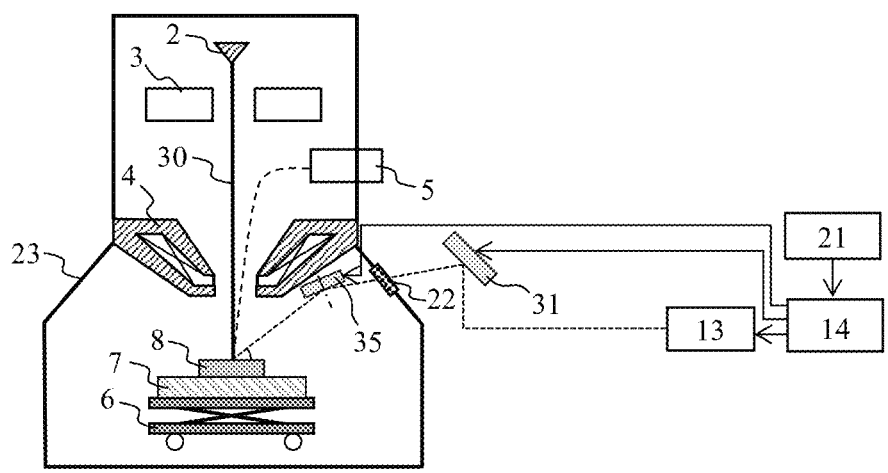
FIG. 14B is a diagram showing an example in which the angle of the light with which the sample 8 is irradiated is adjusted by a mirror 35 installed outside a device housing 23.

FIG. 14B is a diagram showing an example in which the angle of the light with which the sample 8 is irradiated is adjusted by a mirror 35 installed outside the device housing 23. The light control unit 14 controls the angle of the light by specifying the inclination angle with respect to the mirror 35.

By using, for example, a wavelength-variable pulse laser as the light source 13, the pulse width and the number of irradiation pulses per unit time can be controlled. The pulse width and the number of irradiation pulses per unit time can be adjusted by the function of the pulse laser or by another function incorporated in an irradiation optical system. For example, the pulse width can be adjusted by a Q switch, and the number of irradiation pulses per unit time can be adjusted by a pulse picker using Pockels cells. The polarization of the pulsed laser can be adjusted by using a similar configuration as that of the third embodiment.

Figure 15A:
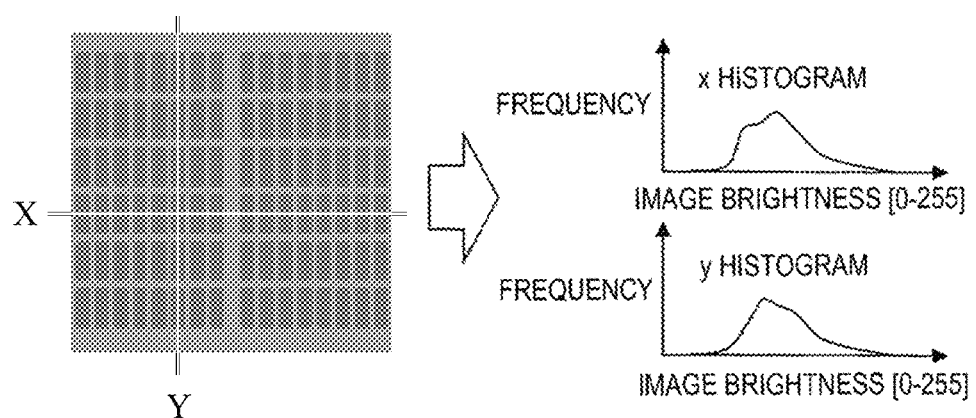
FIG. 15A is a diagram showing an example in which a histogram of brightness of the SEM image is acquired in each of the X and Y directions.

FIG. 15A shows an example in which a histogram of brightness of the SEM image is acquired in each of the X and Y directions. Sample 8 used was similar as that shown in FIG. 12A. The brightness histogram represents a frequency distribution of the brightness value of each pixel in the SEM image. As long as the contrast can be optimized, a brightness difference histogram may be used instead of the brightness histogram. Further, luminance may be used instead of brightness. In the following description, it is assumed that the brightness histogram is used.

Figure 15B:
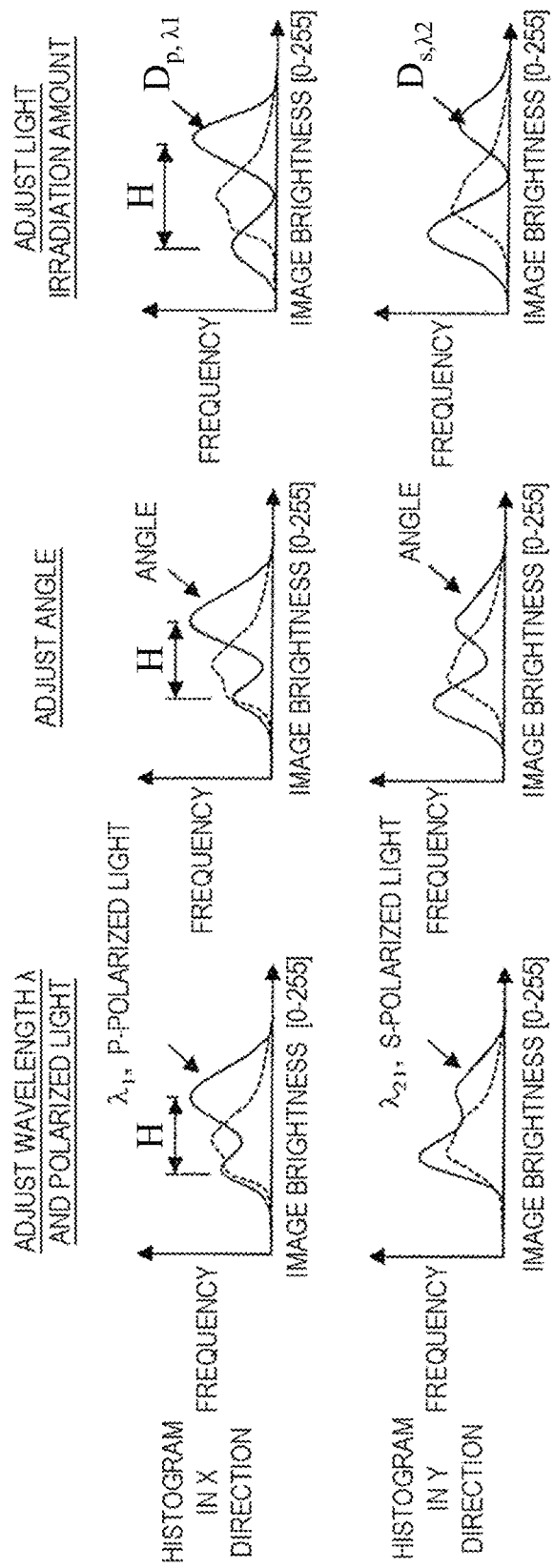
FIG. 15B is a diagram showing a procedure for maximizing a contrast using a brightness histogram.

FIG. 15B shows a procedure for maximizing the contrast using the brightness histogram. In order to maximize the image contrast, it is considered to be sufficient to specify the optical parameter at which the frequency peak interval H of the brightness histogram is the largest. In the example shown in FIG. 15B, the light control unit 14 first creates a brightness histogram while changing the wavelength and the polarization plane, and specifies the wavelength and the polarization plane at which the peak interval H is the maximum. Next, the light control unit 14 specifies a light irradiation angle at which the peak interval H is the maximum. Finally, the light control unit 14 specifies the irradiation amount of light per unit time having the maximum peak interval H. The irradiation amount can be adjusted by, for example, a pulse width, the number of pulses included per unit time, an average output of the pulsed laser, and the like.

The peak interval H can be maximized for each optical parameter. In addition to the optical parameters illustrated in FIG. 15B, the peak interval H may be maximized for each of the wavelength, the irradiation direction (azimuth angle) with respect to the sample, the irradiation cycle of light, and the like. The order of adjustment may be from any parameter. An optimum value of the optical parameter may be adjusted for each observation direction. Further, when the optimum optical parameter is determined according to the feature amount of the sample 8 (for example, when the optimum optical parameter is determined by the procedure as described in the first embodiment), only the other optical parameters may be adjusted. For example, when the p-polarized light is optimal in the X direction and the s-polarized light is optimal in the Y direction, for the brightness histogram in the X direction, only the wavelength may be optimized on the premise of p-polarized light, and for the brightness histogram in the Y direction, only the wavelength may be optimized on the premise of s-polarized light.

Figure 16:
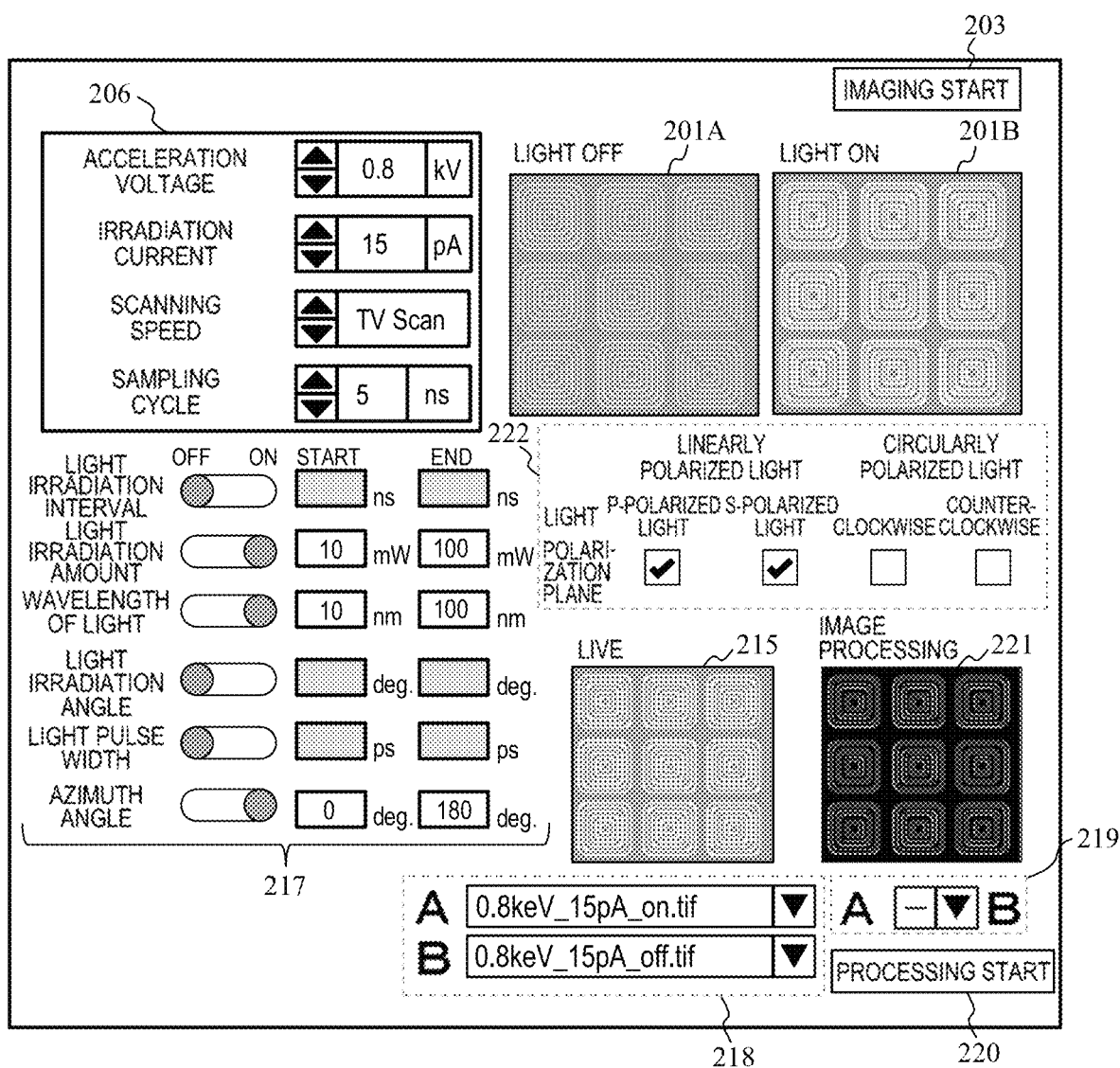
FIG. 16 is a diagram showing an example of a GUI provided by the display unit 20 in a fourth embodiment.

FIG. 16 is an example of the GUI provided by the display unit 20 in the fourth embodiment. The user inputs the optical parameter for searching for the optimum value and a search range on a light irradiation condition selection unit 217. The polarization plane to be emitted on a polarization type selection unit 222 is checked. The wavelength of the light to be emitted, the irradiation amount per unit time, the irradiation angle, the light irradiation interval, the irradiation direction (azimuth angle) of the light with respect to the sample, and the pulse width can be set. The display unit 201A displays an SEM image when light is not emitted, and the display unit 201B displays an image captured by using the optical parameter having the largest peak interval H. The live image display unit 215 displays the SEM image during an optical parameter search. An image processing display unit 221 displays a composite image or a difference image of acquired images. The user selects an image file in an image selection unit 218. Next, the user determines an image calculation method on a calculation selection unit 219. For example, when it is desired to output the difference image between the images A and B selected in the image selection unit 218, a minus symbol is selected, and when it is desired to output the composite image, a plus symbol is selected. When a processing start button 220 is selected, the image processing unit 17 starts image processing.

Fourth Embodiment: Overview

The charged particle beam device 1 according to the fourth embodiment specifies the optical parameter such that the peak interval H of the brightness histogram of the SEM image is large. This makes it possible to optimize the optical parameters so as to improve a pattern contrast of the SEM image.

Fifth Embodiment

Although in the embodiment described above, an example in which the shape patterns on the sample 8 are linearly arranged and p-polarized light or s-polarized light is used according to the observation direction has been described, the invention can be applied to other shape patterns. In a fifth embodiment of the invention, as an example, an example of improving image contrast of an SEM image obtained by imaging magnetic domains of a material will be described. The configuration of the charged particle beam device 1 is similar as that according to the first and second embodiments. The polarization conversion plate 32 may be a $\lambda/2$ polarizing plate or a $\lambda/4$ polarizing plate, or may be a combination of the $\lambda/2$ polarizing plate and the $\lambda/4$ polarizing plate. Other elements capable of converting the polarization plane may be used. The GUI is similar as that in FIG. 16.

Figure 17:
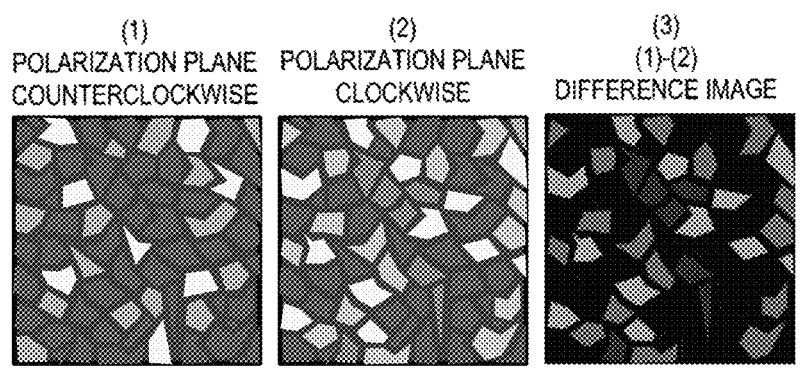
FIG. 17 is a diagram showing an example of the SEM image in which an image contrast of a magnetic domain of the sample 8 is improved.

FIG. 17 is a diagram showing an example of the SEM image in which the image contrast of the magnetic domain of the sample 8 is improved. As sample 8, an iron thin film having domains to be magnetic domains was used. Irradiation conditions of the electron beam 30 are an acceleration voltage of 0.5 keV, an irradiation current of 20 pA, and a scanning speed of 100 nsec/pixel. The light irradiation conditions were a wavelength of 800 nm, and the polarization plane was (1) counterclockwise circularly polarized light and (2) clockwise circularly polarized light. When the sample 8 having domains to be magnetic domains is irradiated with light having different circular circularly polarized light on the left and right sides, different absorption coefficients are obtained for each magnetization axis due to the magnetic circular dichroism. That is, the SEM image obtained under the light irradiation in which the polarized light is controlled has a contrast reflecting a state of the magnetic domain. In (1) of FIG. 17, a signal amount in the region having the magnetic domain of an upward component with respect to the ground increases, whereas in (2) of FIG. 17, a contrast in the region having the magnetic domain of a downward component with respect to the ground increases. Further, a difference image between (1) and (2) of FIG. 17 is acquired using the GUI of FIG. 16 ((3) of FIG. 17). By performing the differential imaging, the influence of different types of polarization plane irradiation with respect to the magnetic domains of the respective domains can be evaluated.

Sixth Embodiment

In a shape pattern included in one SEM image by a plurality of electron beam irradiations, since the feature amount in the X direction and the feature amount in the Y direction of the shape pattern are different from each other, the light absorption coefficients in the respective directions are different from each other. Therefore, in the sixth embodiment of the invention, in a wide-field observation by a plurality of electron beam irradiations, a procedure for uniformly improving the contrast in each observation direction even when the feature amount in each observation direction is different will be described. There will be described the charged particle beam device that controls an amount of emitted electrons from the sample at the time of electron beam irradiation by controlling the polarization plane and other optical parameters of an intermittently irradiated light to achieve image acquisition having the high image contrast.

Figure 18:
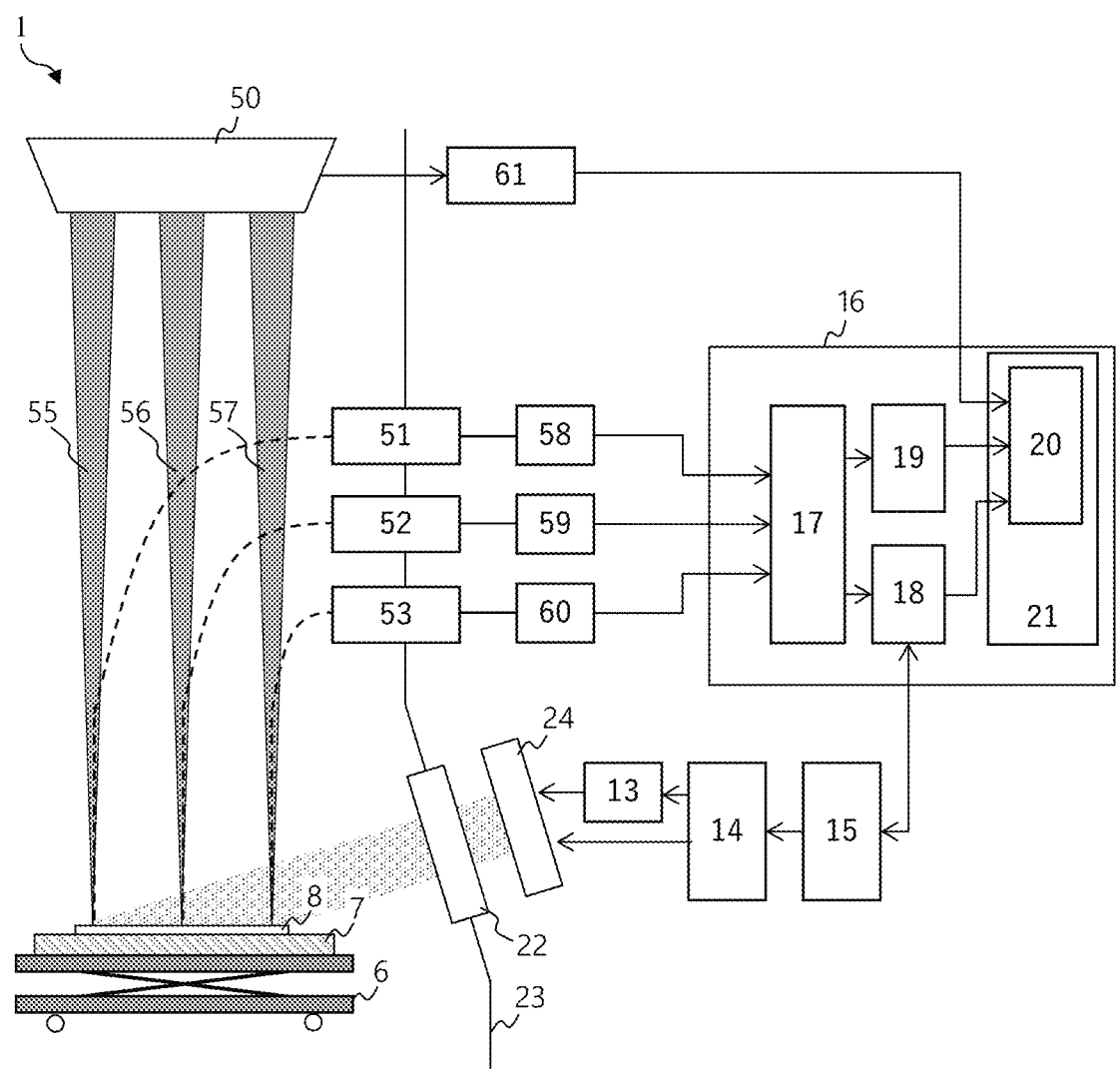
FIG. 18 is a configuration diagram of the charged particle beam device 1 according to a sixth embodiment.

FIG. 18 is a configuration diagram of a charged particle beam device 1 according to the sixth embodiment. The charged particle beam device 1 is configured as a multi-beam scanning electron microscope that acquires an observation image of the sample 8 in a wide visual field by irradiating the sample 8 with electron beams 55, 56, 57 (primary charged particle). The charged particle beam device 1 includes the electron optical system, the stage mechanism system, the electron beam control system, the light irradiation system, and the main console 16. The electron optical system includes a multi-beam optical device 50 that forms and irradiates a plurality of electron beams, and detectors 51, 52, and 53. The stage mechanism system includes the XYZ stage 6 and the sample holder 7. The electron beam control system includes a multi-beam electron beam control unit 61, a detection control unit (a) 58, a detection control unit (b) 59, and a detection control unit (c) 60. The light irradiation system includes the light source 13, the light control unit 14, the light irradiation unit 24, and the input setting unit 21. The main console 16 includes the image forming system and the input and output system. The image forming system includes the image processing unit 17 having the detection sampling function synchronized with the deflection signal and the image signal processing unit 19. The input and output system includes the input setting unit 21 for imaging conditions of the electron beam 55, 56 and 57 and the display unit 20. The feature amount extraction unit 18 acquires the shape pattern of the sample 8 and extracts the feature amount of the shape pattern. The optical parameter specifying unit 15 determines the parameter that maximizes the absorption coefficient of the light with which the sample 8 is irradiated, according to the feature amount. The feature amount extraction unit 18 extracts the feature amount such as dimension/density/period/area/contour line of the shape pattern/photophysical property of the material constituting the sample 8 from the SEM image, the electron emitting signal, the design data, and the like.

The electron beams 55, 56, and 57 accelerated by the multi-beam optical device 50 are emitted to the sample 8, and the irradiation positions of the electron beams 55, 56, and 57 on the sample 8 are controlled. The detector 5 detects emitted electrons (secondary charged particles) emitted from the sample 8 by irradiating the sample 8 with the electron beam 55, 56, and 57. The input setting unit 21 is the functional unit for the user to specify and input the acceleration voltage, the irradiation current, the deflection condition, the detection sampling condition, the electron lens condition, and the like.

Figure 19:
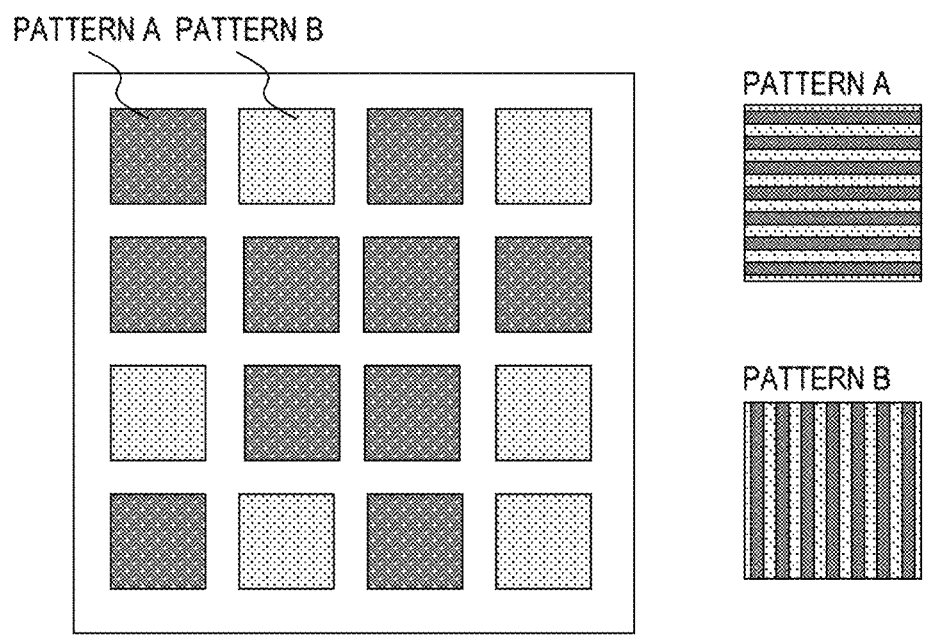
FIG. 19 is a diagram showing an SEM image acquired by a plurality of electron beam irradiations.

FIG. 19 is an SEM image acquired by a plurality of electron beam irradiations. As shown in FIG. 19, since the SEM observation can be performed by a plurality of electron beam irradiations, a region that can be acquired by one observation is enlarged. As a result, since observation can be performed in the wide visual field, regions having different pattern feature amounts are acquired in one image. In the present example, as shown in FIG. 19, the image was captured under the conditions and the sample in which a pattern A and a pattern B having similar pattern pitch but different pattern formation directions were mixed in one visual field.

First, feature amount extraction of a shape pattern is performed for each SEM image acquired by each detector. In the present embodiment, an extracting method of the feature amount with respect to the shape pattern of the sample was specified from the line pitch of the sample pattern used in the third embodiment.

Figure 20:
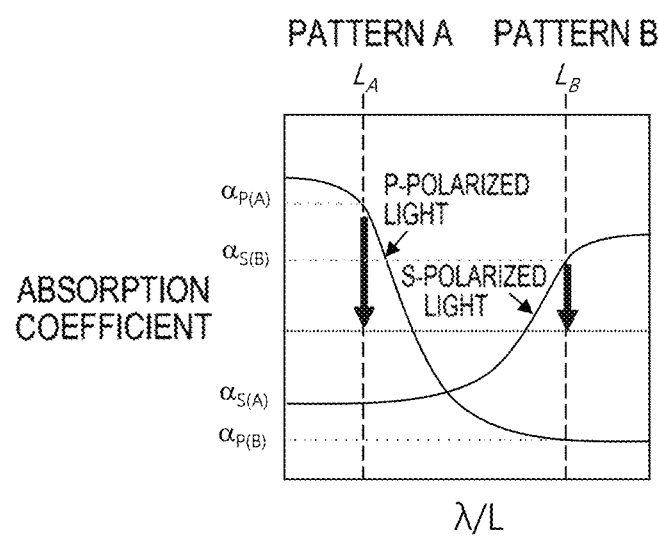
FIG. 20 is a diagram showing a method of determining a light irradiation condition from a feature amount extracted by a feature amount extraction unit 18.

FIG. 20 is a diagram showing a method of determining the light irradiation condition from the feature amount extracted by the feature amount extraction unit 18 from each image acquired by the plurality of electron beam irradiations. In the graph of FIG. 20, the horizontal axis represents the ratio between the wavelength $\lambda$ and the line pitch L, and a vertical axis represents the absorption coefficient of irradiation light with respect to the sample 8. A line pitch $L_A$ of the pattern A and a line pitch $L_B$ of the pattern B are plotted. When an irradiation amount $D_A$ per unit time of the with respect to the pattern A and the irradiation amount $D_B$ per unit time with respect to the pattern B become equal to each other, the contrast at each line pitch is uniform. The irradiation amount per unit time of each polarization plane is calculated by Math (9) and (10).

$$D_A = D^S_{pulse} \cdot \alpha_{S(A)} + D^P_{pulse} \cdot \alpha_{P(A)} \qquad \text{[Math 9]}$$

$$D_B = D^S_{pulse} \cdot \alpha_{S(B)} + D^P_{pulse} \cdot \alpha_{P(B)} \qquad \text{[Math 10]}$$

$\alpha_{P(A)}$ is an absorption coefficient of p-polarized light with respect to the wavelength $\lambda$ and the line pitch $L_A$, $\alpha_{S(A)}$ is an absorption coefficient of s-polarized light with respect to the wavelength $\lambda$ and the line pitch $L_A$, $\alpha_{P(B)}$ is an absorption coefficient of the p-polarized light with respect to the wavelength $\lambda$ and the line pitch $L_B$, and $\alpha_{S(B)}$ is an absorption coefficient of s-polarized light with respect to the wavelength $\lambda$ and the line pitch $L_B$. $D_A$ and $D_B$ are irradiation amounts per unit time of p-polarized light and s-polarized light with which the sample 8 is irradiated. By adjusting either or both of $D^P_{pulse}$ and $D^S_{pulse}$ such that $D_A = D_B$, the contrast in each direction can be made uniform.

Figure 21:
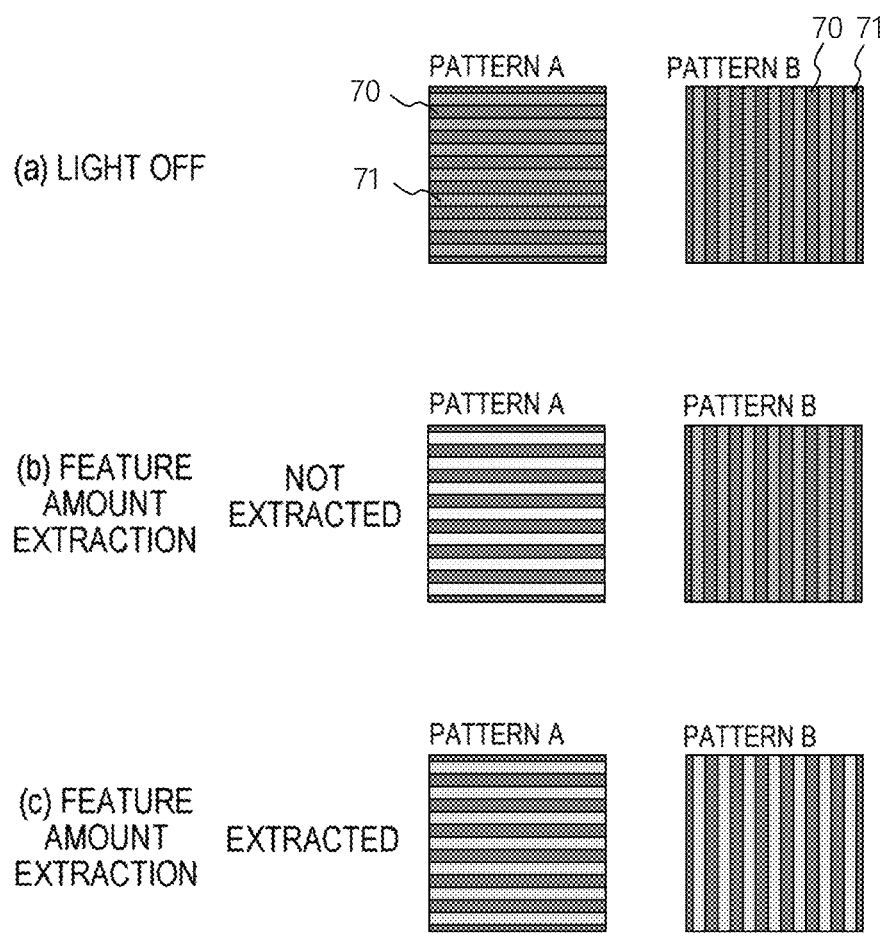
FIG. 21 is a diagram showing an effect of contrast control under a light irradiation condition according to a sixth embodiment.

FIG. 21 is a diagram showing a result of observation by controlling the irradiation amount per unit time with respect to each polarization plane. As the sample 8, a sample in which a pattern of polysilicon 71 was formed on an underlying silicon 70 was used. Although in the polysilicon 71, lines and spaces having the same pitch are formed in the X direction and the Y direction, the pattern A and the pattern B are formed in different phases by 90 degrees. Irradiation conditions of the electron beam 30 are an acceleration voltage of 5.0 keV, an irradiation current of 5 nA, and a scanning speed of 100 nsec/pixel. The light irradiation conditions are a wavelength of 405 nm and a detection sampling of 20 nsec. The polarization plane and the irradiation amount per unit time were controlled such that the contrast was constant in accordance with the procedure described with reference to FIG. 20. The GUI is similar as that in FIG. 13.

Observation was performed on the sample having the shape pattern shown in FIG. 19. In order to make the effect of improving the contrast constant at each of the patterns A and B, from Math (9) and (10), it was found that it is necessary to control the irradiation amount per unit time of the s-polarized and p-polarized light with respect to the pattern A to be ½ of the irradiation amount per unit time of the s-polarized and p-polarized light with respect to the pattern B. Under a condition of the light irradiation OFF in (a) of FIG. 21, the contrast difference between the polysilicon 44 and the silicon carbide substrate 46 is small. When the SEM image is acquired under the condition that the light is emitted without extracting the feature amount of the shape pattern shown in (b) of FIG. 21, the contrast difference between the silicon and the polysilicon of the pattern B is small as compared with the contrast between the silicon and the polysilicon in the pattern A, and the uniform contrast improvement effect cannot be obtained in the patterns A and B. On the other hand, as a result of controlling the light irradiation amount per unit time for each polarized light according to the feature amount of the shape pattern, a uniform contrast improvement effect was confirmed in both the pattern A and the pattern B as shown in (c) of FIG. 21.

Although in the sixth embodiment, the light amount variable filter is used to control the irradiation amount per unit time, in the case of the pulse laser, a pulse picker may be used instead of the light amount variable filter to control the number of pulses per unit time of p-polarized light to be ⅔ of the number of pulses per unit time of s-polarized light.

The charged particle beam device 1 according to the sixth embodiment specifies the optical parameter according to the feature amount of the pattern shape of the sample 8, and adjusts the irradiation amount per unit time for each optical parameter according to the light absorption coefficient corresponding to each optical parameter. Accordingly, the contrast for each optical parameter can be made uniform. Therefore, for example, even when the feature amount of the sample 8 is different for observation directions, uniform contrast can be obtained.

Modification of Invention

The invention is not limited to the embodiments described above, and includes various modifications. For example, the embodiments described above are described in detail for easy understanding of the invention, and the invention is not necessarily limited to those including all configurations described above. A part of a configuration of an embodiment may be replaced with a configuration of another embodiment, or a configuration of another embodiment may be added to the configuration of the embodiment. A part of the configuration of each embodiment may be combined with another configuration, omitted, or replaced with another configuration.

Although in the embodiment described above, an example in which the charged particle beam device 1 is configured as a scanning electron microscope has been described as a configuration example of acquiring the observation image of the sample 8, the invention can also be used in other charged particle beam devices. That is, the invention can be applied to other charged particle beam devices that adjust the emission efficiency of the secondary charged particles by irradiating the sample 8 with light.

Although in the embodiment described above, the pulsed laser is used as the light source 13, other light sources that can be irradiated with light can also be used. In FIG. 3, although an example in which polarized light is controlled by using the polarization conversion plate 32 has been described, the polarized light may be controlled by using another way. For example, a directly polarized light may be converted into circularly polarized light or elliptically polarized light by using a λ/4 polarizing plate.

In the fourth embodiment, the configuration for adjusting the irradiation angle of light is not limited to those illustrated in FIGS. 14A and 14B. For example, in FIG. 14B, the irradiation angle of light may be controlled by adjusting an angle of the adjustment mirror 31.

In the embodiment described above, as the photophysical property of the shape pattern of the sample, an optical absorptance of the material of the sample 8, an optical reflectance of the material of the sample 8, a dielectric constant of the material of the sample 8, an Abbe number of the material of the sample 8, an optical refractive index of the material of the sample 8, and the like are considered.

In the embodiment described above, in order to reliably increase an efficiency of emitted electrons by irradiating the sample 8 with light, it is desirable to irradiate the sample 8 with light at a time interval shorter than the cycle of irradiating the sample 8 with the electron beam 30.

In the embodiment described above, the main console 16 can be configured with an arithmetic device such as a computer. The functional units (the image processing unit 17, the feature amount extraction unit 18, and the input setting unit 21), the light control unit 14, and the optical parameter specifying unit 15 included in the main console 16 may be configured by using hardware such as a circuit device in which the functions are implemented, or may be configured by executing, by the arithmetic device, software in which the functions are implemented.

REFERENCE SIGN LIST 1 charged particle beam device
2 electron gun
3 deflector
4 electron lens
5 detector
6 XYZ stage
7 sample holder
8 sample
9 electron gun control unit
10 deflection signal control unit
11 detection control unit
12 electronic lens control unit
13 light source
14 light control unit
15 optical parameter specifying unit 16 main console
17 image processing unit
18 feature amount extraction unit
19 image signal processing unit
20 display unit
21 input setting unit
22 glass window
23 housing
24 light irradiation unit
25 irradiation light
30 electron beam
31 adjustment mirror
32 polarization conversion plate
33 light amount variable filter
34 wavelength conversion unit
41 anti-reflection film
42 resist
43 silicon substrate
44 polysilicon
45 oxide film
46 silicon carbide substrate
47 non-polarization beam splitter
49 beam monitor
50 multi-beam optical device
51 detector
52 detector
53 detector
55 electron beam
56 electron beam
57 electron beam
58 detection control unit (a)
59 detection control unit (b)
60 detection control unit (c)
61 multi-beam electron beam control unit
70 silicon
71 polysilicon
81 storage device
201A display unit
201B display unit
202 difference image display unit
203 imaging start button
204 differential imaging button
205 polarization plane setting unit
206 image acquisition operation specifying unit
207 display unit
208 display unit
209 light irradiation condition monitoring unit
210 imaging condition display unit
211 imaging condition display unit
212 feature amount extraction field
213 polarization plane ratio adjusting unit
214 irradiation amount adjusting unit
215 live image display unit
216 polarization type selection button
217 light irradiation condition selection unit
218 image selection unit
219 calculation selection unit
220 processing start button
221 image processing display unit
222 polarization type selection unit

The invention claimed is:

1. A charged particle beam device configured to irradiate a sample with a charged particle beam, the charged particle beam device comprising:
a charged particle source configured to irradiate the sample with primary charged particles;
a light source configured to emit light to be emitted to the sample;
a detector configured to detect secondary charged particles generated from the sample by irradiating the sample with the primary charged particles;
an image processing unit configured to generate an observation image of the sample by using the secondary charged particles detected by the detector; and
a light control unit configured to control one or more optical parameters each representing a physical property of the light, wherein
the one or more optical parameters comprises a polarization plane of the light, and
the light control unit causes the image processing unit to generate the observation image having a contrast corresponding to a changed polarization plane obtained by changing the polarization plane of the light.

2. The charged particle beam device according to claim 1, wherein
the light control unit controls the polarization plane of the light to a first polarization plane to make the sample have a first light absorption coefficient corresponding to the first polarization plane, thereby causing the image processing unit to generate the observation image, and
the light control unit controls the polarization plane of the light to a second polarization plane which is different from the first polarization plane to make the sample have a second light absorption coefficient corresponding to the second polarization plane, thereby causing the image processing unit to generate the observation image.

3. The charged particle beam device according to claim 1, wherein
the one or more optical parameters further comprises at least one of
an angle formed between the light and a coordinate axis on a horizontal plane when the light is projected on the horizontal plane;
an angle formed between the light and a coordinate axis on a vertical plane when the light is projected on the vertical plane;
a wavelength of the light;
an irradiation cycle of the light; and
an irradiation amount of the light per unit time.

4. The charged particle beam device according to claim 1, wherein
the image processing unit generates a first observation image of the sample when the light control unit adjusts the changed polarization plane according to a first parameter and generates a second observation image of the sample when the light control unit adjusts the changed polarization plane according to a second parameter,
the image processing unit generates a difference image by obtaining a difference between the first observation image and the second observation image, and
the charged particle beam device further includes a display unit configured to display the difference image.

5. The charged particle beam device according to claim 1, wherein
the light control unit acquires a histogram of luminance values or a brightness values of respective pixels included in the observation image or a histogram of luminance differences or brightness differences of respective pixel included in the observation image, and the light control unit adjusts the one or more optical parameters such that a frequency peak interval on the histogram is maximized.

6. The charged particle beam device according to claim 5, wherein
the light control unit is configured to control a first parameter and a second parameter of one of the one or more optical parameters,
the light control unit acquires, as the histogram, a first histogram when the optical parameter is the first parameter and acquires a second histogram when the optical parameter is the second parameter, and
the light control unit controls the first parameter such that a frequency peak interval on the first histogram is maximized, and controls the second parameter such that a frequency peak interval on the second histogram is maximized.

7. The charged particle beam device according to claim 1, wherein
the light control unit irradiates the sample with the light at every second time interval that is shorter than a first time interval at which the sample is irradiated with the primary charged particles, and
the light control unit is further configured to control an irradiation amount of the light per unit time by controlling at least one of an average intensity of the light, an irradiation time width of the light, an irradiation cycle of the light, the second time interval, and an irradiation number of the light per unit time.

* * * * *